(12) United States Patent
Bernstein

(10) Patent No.: US 6,388,789 B1
(45) Date of Patent: May 14, 2002

(54) MULTI-AXIS MAGNETICALLY ACTUATED DEVICE

(75) Inventor: Jonathan Bernstein, Medfield, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 09/666,018

(22) Filed: Sep. 19, 2000

(51) Int. Cl.$^7$ .............................................. G02B 26/08

(52) U.S. Cl. ...................... 359/198; 359/199; 359/223; 359/224; 359/226; 359/900; 385/18

(58) Field of Search ................................ 359/196–226, 359/872, 566, 900; 310/36, 40 R, 46, 66, 208; 385/16–18

(56) References Cited

U.S. PATENT DOCUMENTS

| | | |
|---|---|---|
| 4,229,081 A | 10/1980 | Jones et al. |
| 4,317,611 A | 3/1982 | Petersen |
| 4,580,873 A | 4/1986 | Levinson |
| 4,725,127 A | 2/1988 | Malinge et al. |
| 5,042,889 A | 8/1991 | Benzoni ...................... 385/16 |
| 5,216,490 A | 6/1993 | Greiff et al. ............... 73/517 R |
| 5,579,148 A * | 11/1996 | Nishikawa et al. .......... 359/214 |
| 5,729,642 A | 3/1998 | Thaniyavarn ................ 385/17 |
| 5,808,780 A | 9/1998 | McDonald ................... 359/290 |
| 5,912,608 A * | 6/1999 | Asada .......................... 359/198 |
| 5,923,798 A | 7/1999 | Aksyuk et al. ............... 385/19 |
| 5,956,292 A | 9/1999 | Bernstein .................... 367/140 |
| 6,005,993 A | 12/1999 | MacDonald ................. 385/16 |
| 6,031,947 A | 2/2000 | Laor ........................... 385/22 |
| 6,049,404 A | 4/2000 | Wu et al. .................... 359/117 |

OTHER PUBLICATIONS

Jackson, "Classical Electrodynamics," $2^{nd}$ Edition, (copyright 1962, 1975) pp. 168–208.

Miller et al., "Electromagnetic MEMS Scanning Mirrors For Holographic Data Storage," Solid–State Sensor and Actuator Workshop, (Jun. 3–6, 1996) pp 183–186.

(List continued on next page.)

Primary Examiner—James Phan
(74) Attorney, Agent, or Firm—Testa, Hurwitz & Thibeault, LLP

(57) ABSTRACT

A multi-axis magnetically actuated device, an array of multi-axis magnetically actuated devices, and a method of fabrication of a multi-axis magnetically actuated device are disclosed. In addition, disclosed is an optical switch comprised of an array of multi-axis magnetically actuated devices and an array of ports adapted to receive an optical waveguide such as, for example, an optical fiber. The multi-axis magnetically actuated device of the invention is capable of rotational movement in two orthogonal directions. In one embodiment, the multi-axis magnetically actuated device comprises two nested rotational members, an inner rotational member nested within an outer rotational member that in turn is nested within a base member. The inner rotational member is mounted by two inner torsional flexures to the outer rotational member that in turn is mounted by two outer torsional flexures to the base member. The inner torsional flexures define an inner axis of rotation while the outer torsional flexures define an outer axis of rotation. The rotational motions of each rotational member arise in response to an interaction between a magnetic influence and a magnetic moment generated by a current passing through coils arranged adjacent to a surface of the inner rotational member. Bulk micromachining techniques enable the members to be formed from a monolithic silicon wafer and can produce a member with a smooth surface. The smooth surface of a member may function as a reflector. In one embodiment, the inner rotational member functions as a reflector.

27 Claims, 19 Drawing Sheets

OTHER PUBLICATIONS

Miller et al., "A Magnetically Actuated MEMS Scanning Mirror," SPIE, vol. 2687 (1996) pp. 47–52.

Rensing et al., "Biaxial Torsional Micromirrors for Display, Scanning and Image Sensing Applications," Proceedings Sensors Expo Chicago (Oct. 6–8, 1998) pp. 427–430.

Hofmann et al., "Electrostatically Driven Micromirrors for a Miniaturized Confocal Laser Scanning Microscope," Part of the SPIE Conference on Miniaturized Systems with Micro–Optics and MEMS Santa Clara (Sep. 1999), SPIE, vol. 3878, pp. 29–38.

* cited by examiner

MULTI-AXIS MAGNETICALLY ACTUATED DEVICE

FIELD OF THE INVENTION

The invention relates generally to the field of micro-electro-mechanical-systems (MEMS). In particular, the invention relates to a multi-axis magnetically actuated micromechanical device.

BACKGROUND OF THE INVENTION

Micro-electro-mechanical-systems (MEMS) are microdevices that are batch-fabricated using micromachining techniques that combine electrical and/or magnetic components with mechanical components. MEMS have several attractive properties. They are small, low in mass and cost little to produce. In one class of MEMS, the microdevice consists of a plate that is suspended by two torsional flexures, or bars, which define an axis about which the plate can rotate. This class of MEMS has a range of applications. In particular, such single axis MEMS devices may be employed as micro-mirror mounts. Micro-mirrors are useful in a variety of optical scanning applications, such as holographic systems, robot vision systems, security systems, video displays, heads-up displays, video cameras, retinal projector displays, laser scanning microscopes and laser detection and ranging systems (LIDAR), and a variety of optical switch applications, such as routing switches, matrix switches, and multiplexers. However, such systems typically require optical scanning, or optical switching, in two orthogonal directions. One method of achieving scanning, or switching, in two orthogonal directions is to place two or more single axis MEMS devices in series. However, a serial arrangement of mirrors always produces optical aberrations of the scanned image. In addition, geometric considerations seriously limit the matrix dimensions of optical matrix switches that employ serial mirror arrangements.

Another method of achieving two orthogonal direction switching, such as that desired in a matrix switch, is to employ electronic switches that perform optical-to-electrical and electrical-to-optical signal conversion. These signal conversions, however, introduce bandwidth limitations, conversion losses, and signal degradation. Another method of achieving two orthogonal direction switching employs an integrated optical waveguide circuit. Waveguide circuits, however, are difficult to expand to large matrix dimensions because waveguide architectures typically require many signal paths to cross one another. Such crossings lead to waveguide cross-talk, signal losses, and require complicated switching algorithms.

Another method of achieving two orthogonal direction scanning is to employ a biaxial, or two-axis, MEMS device. Such a device may consist of a inner plate suspended by two bars, defining one axis of rotation, which are attached to an outer plate that is in turn suspended by two bars that define another, orthogonal, axis of rotation. Several methods are known to actuate the rotational motion of the plates. One method of actuation is by piezoelectric drive. However, piezoelectric drive requires the use of linkages and coupling mechanisms to transfer the motion to the plates. Accordingly, geometric considerations make it difficult to transfer piezoelectric motion to the nested plates of a two-axis MEMS device. Further, it is often difficult to match the low mechanical impedance of a rotatable plate to the high impedance of a typical piezoelectric actuator, such as a stack or length extender bar. Another method actuates the rotation electrostatically. However, electrostatic actuation requires the use of high voltages (hundreds, or thousands, of volts) to achieve large angular deflection (greater than 20 degrees) of plates larger than about one millimeter square. Such high voltages are not readily compatible with standard CMOS and battery operated equipment. Electrostatic actuation is also highly nonlinear and, as a result, the plate can "snap down" if over-actuated and reduce angular precision. Consequently, current two-axis MEMS devices suffer from the inability to provide large angular deflection of "large" rotational elements in a compact device with operational voltages that are readily compatible with standard device logic and other devices.

SUMMARY OF THE INVENTION

The invention, in one embodiment, provides a multi-axis magnetically actuated device capable of high angular deflection about each axis without the necessity of high actuation voltages. In one aspect, the invention provides a small, lightweight two-axis micromechanical device which has a high torque and a high bandwidth about both axes. In another aspect, a two-axis magnetically actuated micromechanical device of the invention provides a useful two-axis optical micro-mount. A wide variety of optical elements can benefit from being mounted on a two-axis mount including, for example, photodetectors, diffraction gratings, reflectors, mirrors, prisms, and optical beam steering elements in general. The embodiments of a micromechanical device of the invention have a wide range of applications, including, but not limited to, optical scanning applications, optical switch applications, and image sensing applications. For example, the invention is useful in such optical scanning applications as holographic systems, robot vision systems, security systems, video displays, heads-up displays, video cameras, retinal projector displays, bar code scanning, laser scanning microscopes and LIDAR. Embodiments of the invention can provide several advantages to an optical scanning application, such as, fast two-dimensional scanning of relatively large mirror elements over large scan, or deflection, angles with high angular precision without the optical aberrations inherent to serial mirror configurations. According to another aspect, the invention provides a device that is compact and that operates with voltages that are readily compatible with other devices and standard device logic.

The invention is useful in such optical switch applications as, for example, series bus access couplers, optical routing switches, optical matrix switches, packet routers, optical logic circuits, reconfigurable networks, and multiplexers such as add-drop multiplexers and space division multiplexers. According to other aspects, optical switches of the invention are also useful in, for example, optical communication network, optical gyroscope, and optical signal processing applications. Embodiments of the invention can also provide several advantages to an optical switch application, including, for example, a compact, scalable, fast response, multiple wavelength, intelligently routable, switching element that can achieve a multitude of stable switching states and which returns to a known state upon removal or loss of power. In addition, the optical switch of the invention achieves these advantages without a time-consuming light-to-electricity-to-light conversion process and without the optical aberrations inherent to serial mirror configurations.

In one embodiment, the invention provides a two-axis magnetically actuated micromechanical device capable of angular deflections of a plate, or rotational member, of up to 45°. According to one aspect, the two-axis magnetically actuated device comprises two nested rotational members, an inner rotational member nested within an outer rotational member that in turn is nested within a base member. The inner rotational member is mounted by two inner torsional flexures to the outer rotational member that in turn is mounted by two outer torsional flexures to the base member. The inner torsional flexures define an inner axis of rotation while the outer torsional flexures define an outer axis of rotation substantially orthogonal to the inner axis. The rotational motions of each rotational member arise in response to an interaction between a magnetic influence, such as a non-uniform external magnetic field, and a magnetic moment generated by a current passing through coils arranged adjacent to a surface of the inner rotational member. Bulk micromachining techniques enable the members to be formed from a monolithic silicon wafer and can produce a member with a smooth surface. The smooth surface of a member may function as a reflector. In one embodiment, the inner rotational member functions as a reflector. Accordingly, in one embodiment the invention provides a two-axis magnetically actuated micromechanical mirror. In another embodiment, the invention provides an inner rotational member that functions as a diffraction grating.

In another embodiment, the invention provides a two-axis magnetically actuated device further comprising a magnet and at least one pole piece. The two-axis magnetically actuated device comprises two nested rotational members, an inner rotational member nested within an outer rotational member that in turn is nested within a base member. The inner rotational member is mounted by two torsional flexures, defining an inner axis of rotation, to the outer rotational member that in turn is mounted by two torsional flexures to the base member, these flexures defining an outer axis of rotation which is substantially orthogonal to the inner axis. Two pairs of coils are arranged adjacent to a surface of the inner rotational member such that application of a current to a coil generates a magnetic moment substantially perpendicular to the surface of the inner rotational member. The magnet and pole piece(s) are arranged to produce a magnetic field gradient across the inner rotational member. Accordingly, the magnet and pole piece(s) are arranged to produce a non-uniform external magnetic field, i.e., a magnetic influence, for interaction with a magnetic moment generated by the coils and thereby actuate a rotational movement of the inner and/or outer rotational members.

In one aspect, the invention provides a device comprised of an array of two-axis magnetically actuated devices. In another aspect, the invention provides an optical switch comprised of a two-axis magnetically actuated device. In a further aspect, the invention provides a compact optical switch adapted for simultaneous independent alignment and full N×N optical switch functionality.

According to another embodiment, the invention provides a method of actuating a multi-axis magnetically actuated device. One such method of actuation includes applying an electric current to a first set, or pair, of coils arranged adjacent to a surface of the inner rotational member to induce a rotational movement of the outer and inner rotational members about the outer axis in response to interaction with a first magnetic influence and, applying an electrical current to a second set, or pair, of coils also arranged adjacent to the surface of the inner rotational member to induce a rotational movement of the inner rotational member about the inner axis in response to interaction with a second magnetic influence.

According to a further embodiment, the invention provides a method of fabricating a multi-axis magnetically actuated device. In one such method of fabrication, a two-axis magnetically actuated micromechanical device is micromachined from a monolithic silicon-on-insulator (SOI) wafer and coils formed by electroplating a metal layer onto an adhesion layer sputtered on the silicon wafer. In this embodiment, the outer rotational member, inner rotational member, and flexures are formed substantially by micromaching techniques such as, for example, photolithography and etching techniques. In another embodiment, a two-axis magnetically actuated device is micromachined from a monolithic SOI wafer and coils formed from wound wire that are incorporated into the inner rotational member. In another embodiment, a two-axis magnetically actuated device is machined, molded and/or stamped from a combination of plastic, metal, silicon, and/or ceramic components and coils formed from wound wire that are incorporated into the inner rotational member.

BRIEF DESCRIPTION OF THE DRAWINGS

The invention is pointed out with particularity in the appended claims. The advantages of the invention described above, together with further advantages, may be better understood by referring to the following description taken in conjunction with the accompanying drawings. In the drawings, like reference characters generally refer to the same parts throughout the different views. Also, the drawings are not necessarily to scale, emphasis instead generally being placed upon illustrating the principles of the invention.

FIGS. 6C–6F show schematic illustrations of various embodiments of array patterns for an array of multi-axis magnetically actuated devices.

DETAILED DESCRIPTION

Figure 1A:
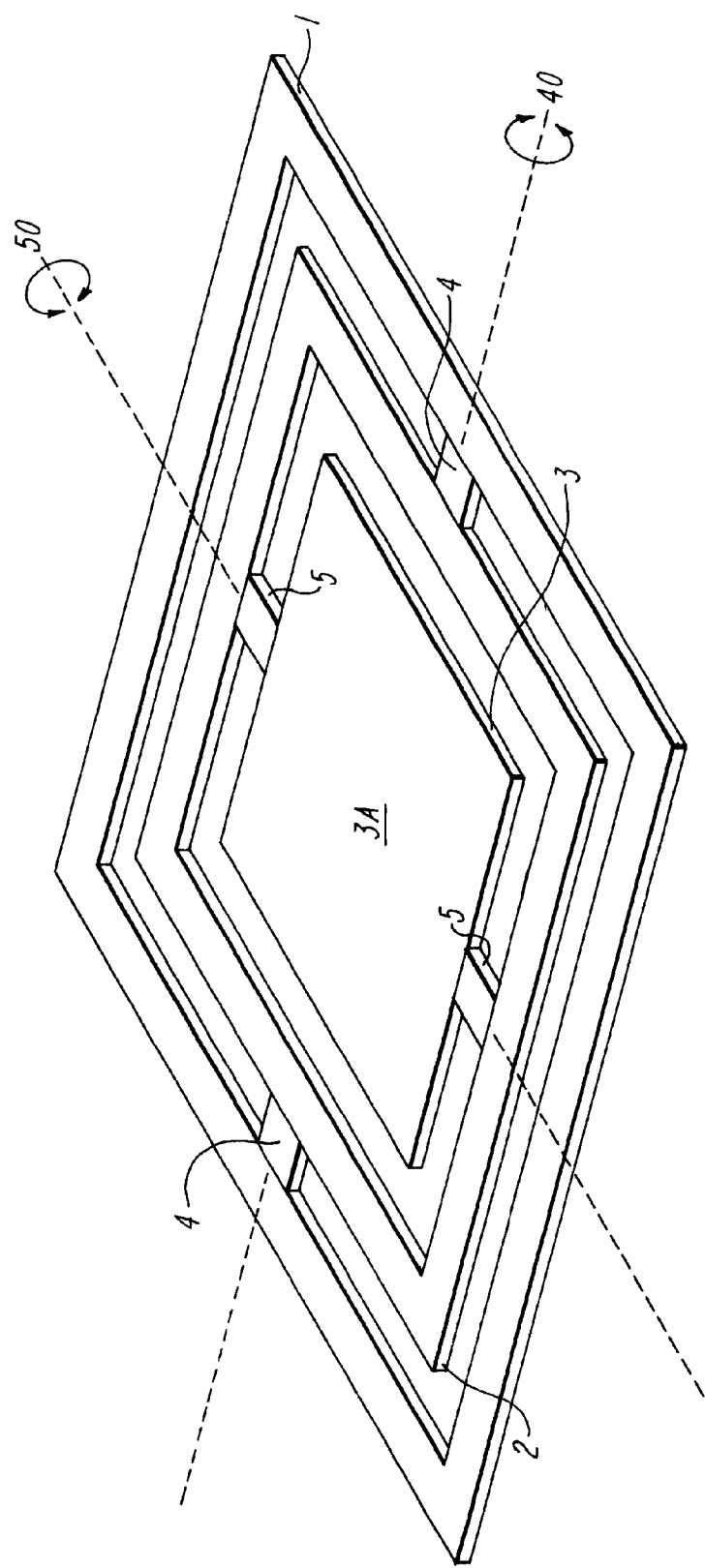
FIGS. 1A–1C show schematic illustrations of two embodiments of a two-axis magnetically actuated device.
Figure 1B:
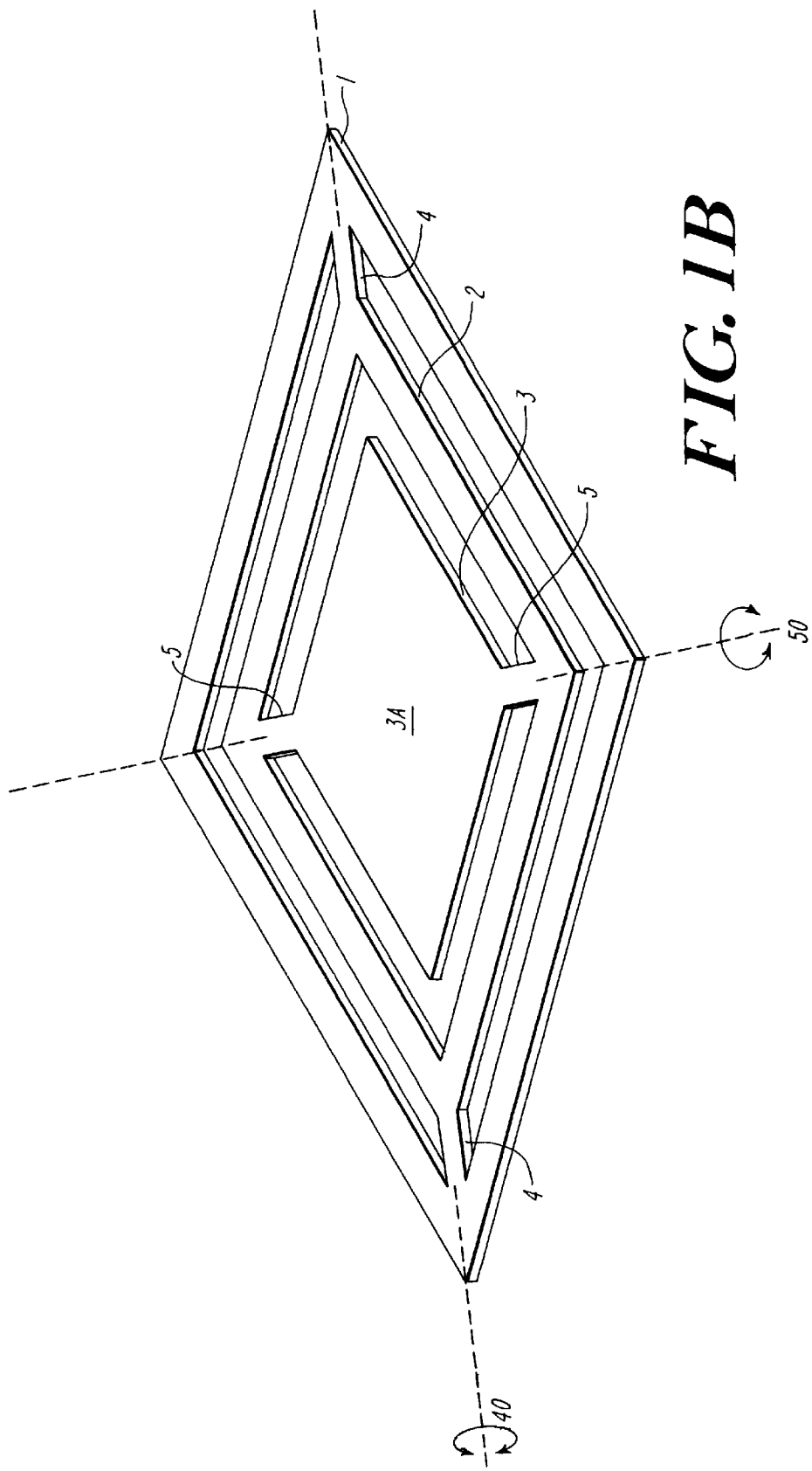
Figure 1C:
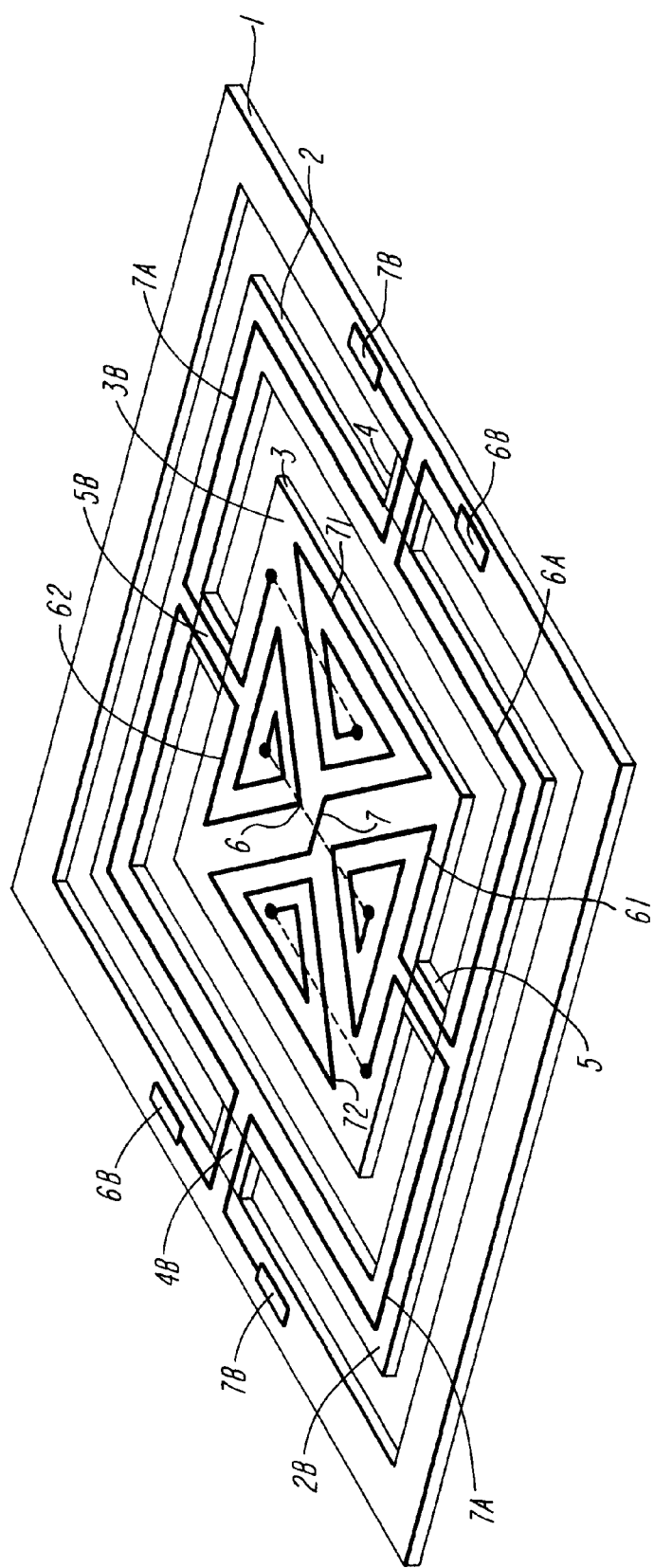

Referring to FIGS. 1A–1C, two embodiments of a two-axis magnetically actuated device of the invention are shown. In each embodiment, the device comprises a base member 1 and a first rotational member 2 suspended by a first set of torsional flexures 4 which connect the base member 1 and the first rotational member 2. The torsional flexures 4 substantially define an axis 40 about which the first rotational member 2 and a second rotational member 3 may rotate. The second rotational member 3 is suspended by a second set of torsional flexures 5 which are connected to the first rotational member 2. The second set of torsional flexures 5 substantially define an axis 50 about which the second rotational member 3 may rotate. The base member 1, the first rotational member 2, the second rotational member 3, the first set of torsional flexures 4, and the second set of torsional flexures 5, may be comprised of the same material, or combination of materials, or different materials, or different combinations of materials. For example, in one embodiment, the base member, first rotational member and the second rotational member, the first set of torsional flexures, and the second set of torsional flexures, are comprised of epitaxial silicon. In a preferred embodiment, the devices of FIGS. 1A–1C are composed of materials which are comprised of layers of two or more materials. In one embodiment, the base member 1, the first rotational member 2, the second rotational member 3, the first set of torsional flexures 4, and the second set of torsional flexures 5, are comprised of a silicon-on-insulator material (SOI). The base member, first rotational member and the second rotational member may further comprise layers of silicon nitride ($Si_3N_4$). The electrically insulating layer of the SOI material may comprise, for example, silicon dioxide ($SiO_2$), silicon nitride, and/or synthetic sapphire. However, it is to be understood that the precise materials used to fabricate the base member, first rotational member, and/or second rotational member may be any material that is workable by micromachining techniques, and preferably by silicon micromachining techniques.

The first set of torsional flexures 4 and the second set of torsional flexures 5 may be comprised of the same material, or combination of materials, as the base member, first rotational member, and/or second rotational member, or of different materials, or combinations of materials. A torsional flexure may be comprised of any material sufficiently elastic to exert a restoring force when subjected to torsional bendings not substantially greater than 45°. Suitable torsional flexure materials for a two-axis magnetically actuated device of the invention include, but are not limited to, silicon, polysilicon, doped polysilicon, silicon on silicon dioxide, silicon nitride, silicon carbide, and nickel. Further, torsional flexures may be coated with a layer of any suitable viscoelastic polymer to dampen unwanted vibration of the torsional flexures. One typical unwanted vibration of a torsional flexure arises from such sources as the rotational movement of the first rotational member and/or the second rotational member. Suitable viscoelastic polymers include, for example, polymers such as polyimide, polyisoprene, and polyamide.

The surface 3A of the second rotational member 3 may be reflective. The reflective surface may comprise a silicon surface, such as a silicon (100) surface. In addition a surface treatment may be applied to surface 3A. The surface treatment may, for example, comprise one or more dielectric layers and/or metal layers disposed adjacent to or on the surface 3A. Suitable dielectric layers include, for example, silicon dioxide and silicon nitride. A metal layer may comprise a reflective metal, such as a thin film silver, thin film gold, or thin film aluminum layer. The surface 3A may be substantially planar, concave, or convex. In one embodiment, the surface 3A comprises a concave reflective surface.

In another embodiment, the surface treatment may comprise formation of a diffraction grating surface on the surface 3A. For example, the slits or grooves of the grating may be formed by the structural morphology of the surface itself, or a patterned layer of material disposed adjacent to or on the surface 3A. Examples of methods suitable for producing slits or grooves in the surface 3A include, but are not limited to, techniques such as microcontact printing, micromachining, photolithography, vapor deposition, controlled anisotropic etching, and laser interferometric photolithography. Examples of structures that may be grown or deposited on the surface 3A to produce slits or grooves include, but are not limited to, carbon nanotubes, nanocrystals and/or nanorods of II–VI and/or III–V semiconductors, such as cadmium selenide (CdSe).

Referring to FIG. 1C, the opposite side of the device illustrated in FIG. 1A is shown. The two-axis magnetically actuated device of FIG. 1A further comprises a first coil pair 6 disposed adjacent to a surface 3B of the second rotational member 3, and a second coil pair 7 also disposed adjacent to the surface 3B of the second rotational member 3. In the illustrative embodiment, the coil pairs 6 and 7 are connected to contacts 6B, 7B, respectively, by lead lines 6A and 7A respectively, disposed adjacent to the surface 2B of the first rotational member 2 and the surface 4B of the first set of torsional flexures 4 and the surface 5B of the second set of torsional flexures 5. Although FIG. 1C illustrates the structural geometry of the coil, lead lines, and contacts for the device illustrated in FIG. 1A, it is to be understood that similar coil, lead lines, and contact structural geometries are present on the opposite side of the device illustrated in FIG. 1B.

The coils, the lead lines, and the contacts may be comprised of the same material, or combination of materials, or different materials, or combinations of materials. In one embodiment, the coils, lead lines, and contacts are comprised of copper (Cu). However, the coils, lead lines, and contacts, may be comprised of any suitable conductive material including, but not limited to, silver (Ag), gold (Au), nickel (Ni), platinum, and alloys thereof. Suitable conductive materials further include, but are not limited to, doped polysilicon, indium tin oxide (ITO), and conductive polymers such as polyaniline, polypyrole, polythiophene, polyphenylenevinylene, and their derivatives. Further, the coil, the lead lines and/or the contacts may further comprise an intermediate medium. This intermediate medium may comprise one or more layers of one or more materials disposed between a coil, lead line and/or contact and the underlying member or flexure. For example, the intermediate medium may be comprised of an adhesion layer, a diffusion barrier layer, an electrically insulating layer and/or a thermal-stress compensation layer. In one embodiment, the coil, lead lines and/or contacts may be disposed on an intermediate layer comprised of an adhesion layer disposed on an insulating layer which is in turn disposed upon the second rotational member, the first torsional flexure, the second torsional flexure, the first rotational member and/or the base member. The coil, lead lines and/or contacts may be also be placed on a layer comprised of materials disposed to compensate for thermal induced stress, such as that caused by differences in the thermal expansion, or contraction, of different materials. One such thermal stress compensation material is silicone rubber.

Figure 2A:
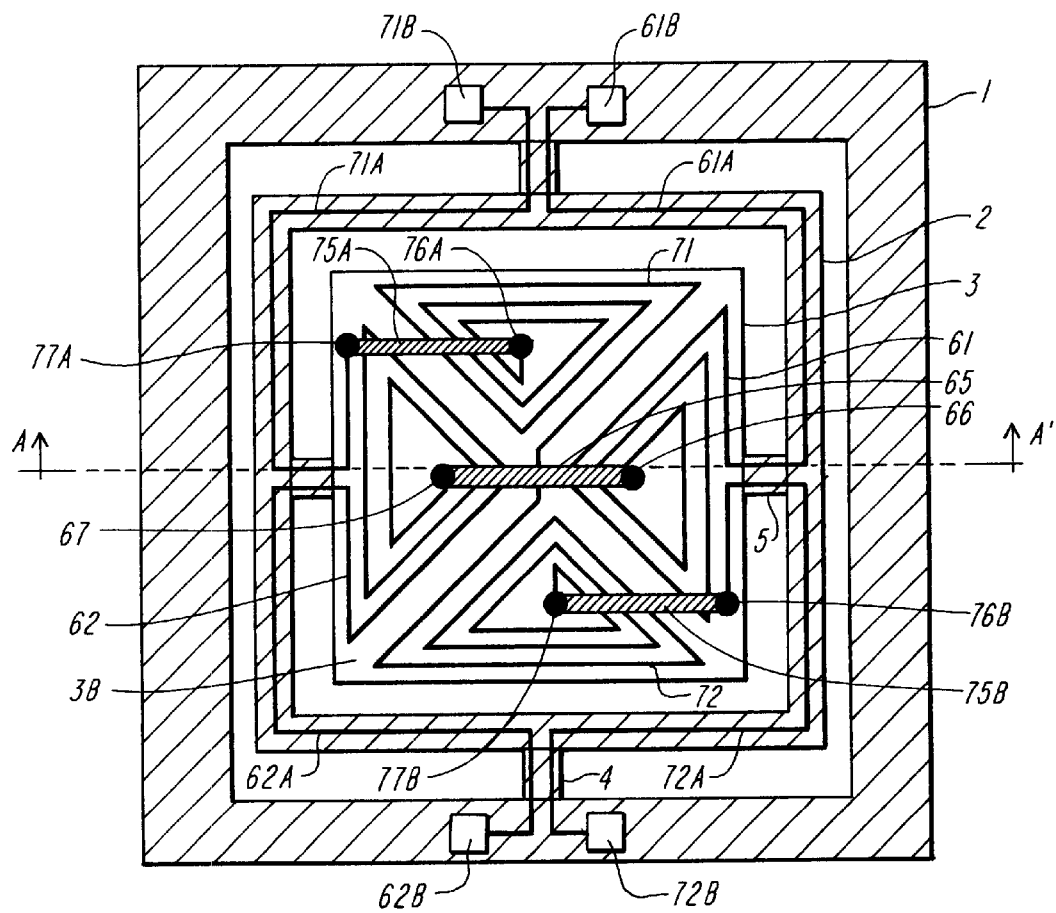
FIG. 2A shows a schematic illustration of an embodiment of a topography for the coil pairs, lead lines and contacts of a two-axis magnetically actuated device.

Referring to FIG. 2A, one embodiment of a topography for the coil pairs, the lead lines, and the contacts of a two-axis magnetically actuated device is shown. A set of four coils 61, 62, 71, and 72 is disposed on the surface 3B of the second rotational member 3, which form two coil pairs, 6 and 7, one for each axis of rotation. The coils, 61, 62, 71, 72, are connected by connectors 65, 75A and 75B, to form the coil pairs 6 and 7 respectively. As illustrated in FIG. 2A, the connector 65 connects the coils 61 and 62 to form an electrically conductive path from the contact 61B to contact 62B through the lead line 61A and the lead line 62A. Likewise, the connectors 75A and 75B provide an electrically conductive path from the contact 71B through the lead line 71A and the coils 71 and 72, through the lead line 72A to the contact 72B. It is to be understood, that as illustrated in FIG. 2A, the connectors 65, 75A and 75B lie out of the plane of the coils 61, 62, 71, 72. Accordingly, the connector 65 connects the points 66 and 67 but does not make electrical contact with either the coil 71 or coil 72. Similarly, the connector 75A connects the points 76A and 77A, while the connector 75B connects the points 76B and 77B, but neither connector makes electrical contact with either the coil 61 or coil 62.

Figure 2B:
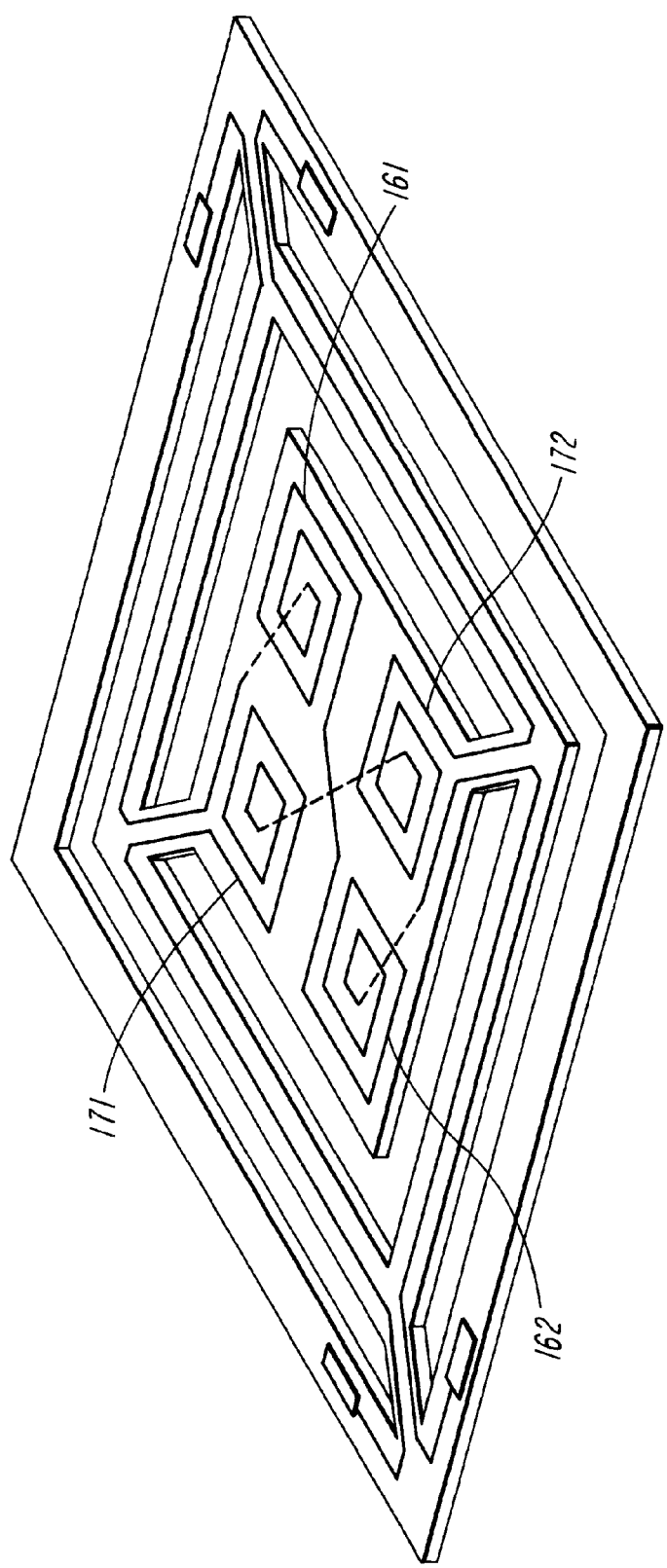
FIGS. 2B–2D show schematic illustrations of various embodiments of a topography for the coil pairs, lead lines and contacts of a two-axis magnetically actuated device.
Figure 2C:
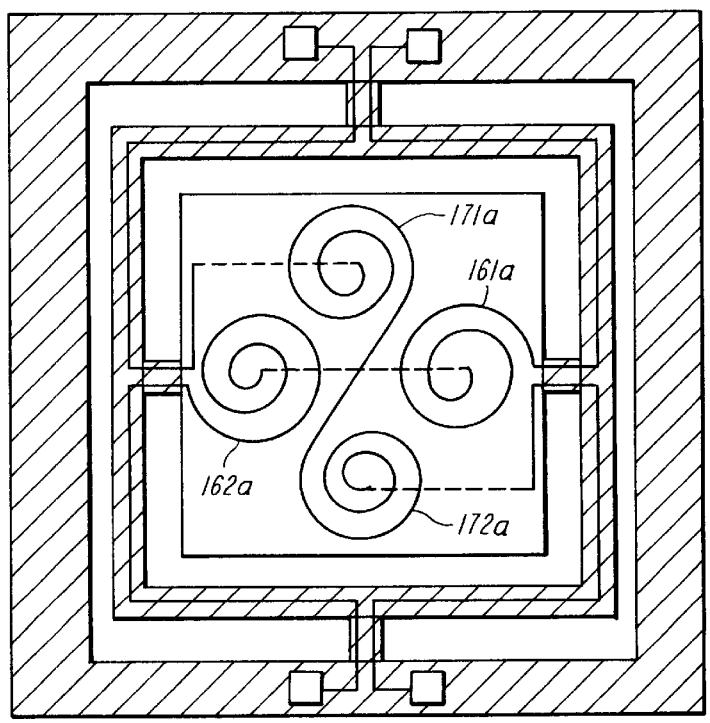
Figure 2D:
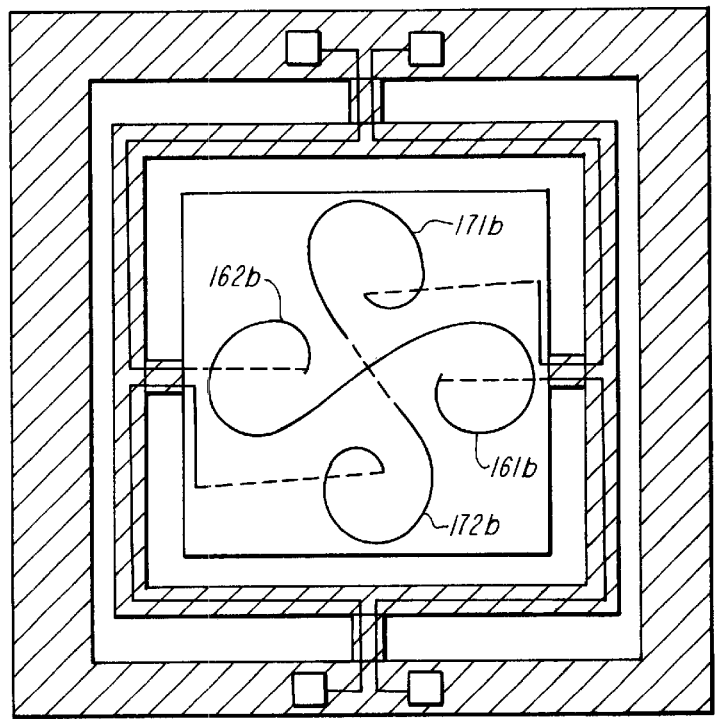

In one embodiment, the coils, the lead lines, and the contacts comprise plated metal. Metals suitable for plating include, but are not limited to, copper (Cu), gold (Au), silver (Ag), platinum (Pt) and alloys thereof. In one embodiment, the connectors, 65, 75A and 75B, are comprised of a thin film metal. Suitable thin film metals include but are not limited to Cu, Au, Pt, nickel (Ni), aluminum (Al) and alloys thereof. The coil pairs, lead lines, contacts, and/or connectors, may be formed by any suitable technique. Suitable techniques include, but are not limited to, evaporative deposition, chemical vapor deposition, argon ion sputtering, and/or electroplating. The coils illustrated in FIG. 2A are arranged in triangular spiral patterns, however, the specific pattern of a coil is not critical to the invention. Rather, it is to be understood that a coil may be arranged in any pattern suitable for producing upon application of a current to the coil a magnetic moment substantially perpendicular to the plane of the coil. Suitable patterns include, but are not limited to, spirals and loops. The coils may comprise a single turn or many turns, however, it is to be realized, that increasing the number of turns in a coil increases the coil generated magnetic moment for a given current. Examples of suitable coil patterns are shown in FIGS. 2B–2D which include: square spirals 161, 162, 171, 172, FIG. 2B; circular spirals 161a, 162a, 171a, 172a, FIG. 2C; and loops 161b, 162b, 171b, 172b, FIG. 2D.

In one embodiment, the coils 61, 62 and 71, 72 are wired in two series pairs, 6 and 7, respectively. Each coil pair, 6 and 7, contains one clockwise and one counter clockwise spiral. As a result, application of an electrical current to a coil pair produces magnetic moments, one pointing into the plane of the page of FIG. 2A, 2B, 2C, or 2D, and the other pointing out of the plane of the page. Interaction of a magnetic moment with an external magnetic field generates a force $\vec{F}$ given, in MKS units, by:

$$\vec{F} = (\vec{m} \cdot \nabla) \vec{B}; \qquad (1)$$

where $\vec{m}$ is the magnetic moment generated by a coil with current passing through and $\vec{B}$ is the magnetic flux density (also know as the magnetic inductance) of the external magnetic field. Accordingly, movement of a rotational member is actuated by interaction of a current applied to a coil pair with a magnetic influence such as a non-uniform external magnetic field. For example, application of a current to the coils 61 and 62 produces a pair of magnetic moments which via interaction with a non-uniform magnetic field produce non-zero forces that act as a "push-pull" pair to produce a rotational movement of the first and second rotational members substantially about the axis 40. Similarly, application of a current to the coils 71 and 72 produces a pair of magnetic moments which via interaction with a non-uniform magnetic field produce non-zero forces that act as a "push-pull" pair to produce a rotational movement of the second rotational members substantially about the axis 50.

Figure 3A:
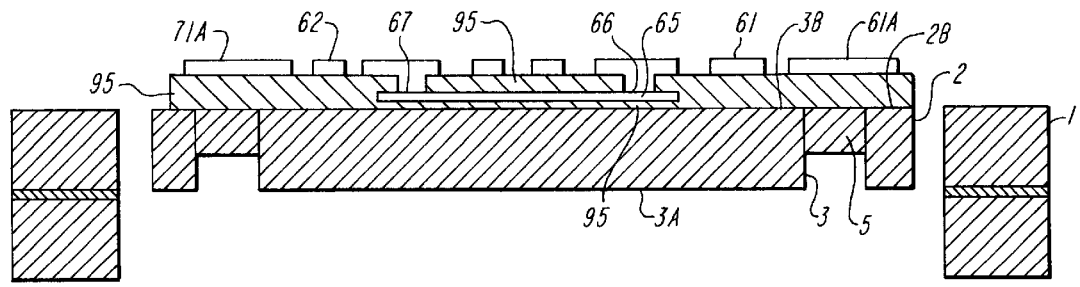
FIGS. 3A–3C show schematic cross sectional illustrations of various embodiments of a two-axis magnetically actuated device.

Referring to FIG. 3A, an illustrative cross section of the device illustrated in FIG. 2A is shown. The cross section in FIG. 3A is taken approximately along the line A–A' illustrated in FIG. 2A. In one embodiment, the coil pairs 6 and 7 are disposed in part on the surface 3B of the second rotational member 3 and in part on an insulating layer 95 that enables connectors, such as 65, 75A and 75B, to make electrical contact with the appropriate coil at the desired point(s) thereon. For example, as illustrated in FIG. 3A, the insulating layer 95 (i.e. an "intermediate medium") is arranged such that the connector 65 may contact the coil pair 6 at points 66 and 67 yet not make electrical contact with the coil pair 7. Suitable insulating layer 95 materials include, but are not limited to, polyimide, silicon dioxide, silicon nitride, and undoped silicon carbide.

Figure 3B:
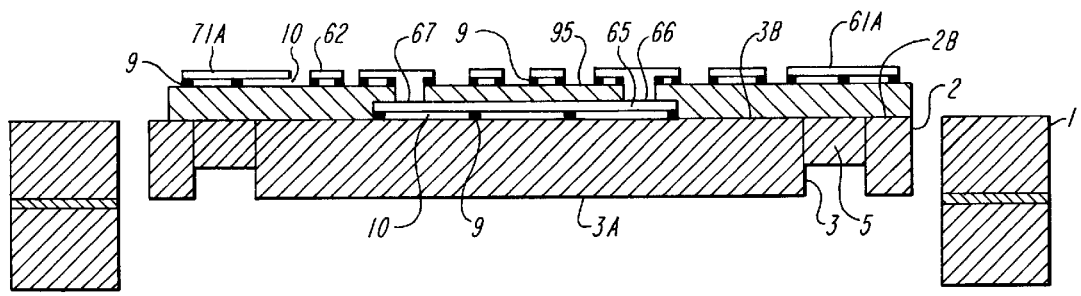

Referring to FIG. 3B, an illustrative cross section of another embodiment of the device illustrated in FIG. 2A is shown for a section taken along the line A–A'. In one embodiment, the coil pairs, 6 and 7, the lead lines, 6A and 7A, and/or the contacts, 6B and 7B, are disposed adjacent to the underlying member and/or flexure structures with a bridge technique. Suitable bridge techniques include, but are not limited to, those disclosed in U.S. Pat. No. 5,216,490, which is herein incorporated by reference. In this embodiment, a bridge layer 9 supports the coil pair, lead line, and/or contact off of the underlying structure, such as the base member, torsional flexure, first rotational member, or second rotational member. The coil pair, lead line, and/or contact is supported only at certain points by the bridge layer 9 leaving voids 10 between the supported structure and the underlying structure. The voids 10 reduce the area of contact between the supported structure and the underlying structure and, as a result, reduce the bimetallic element effect. Suitable bridge layers may be comprised of any layer and/or materials suitable for an intermediate medium, including, but not limited to, an adhesion layer, a diffusion barrier layer, an electrically insulating layer and a thermal-stress compensation layer.

Figure 3C:
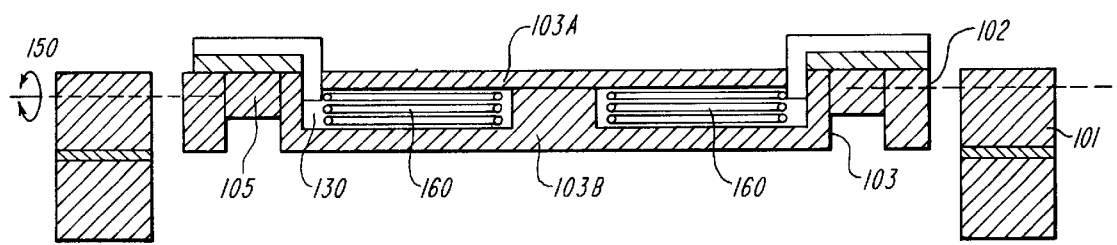
Figure 3D:
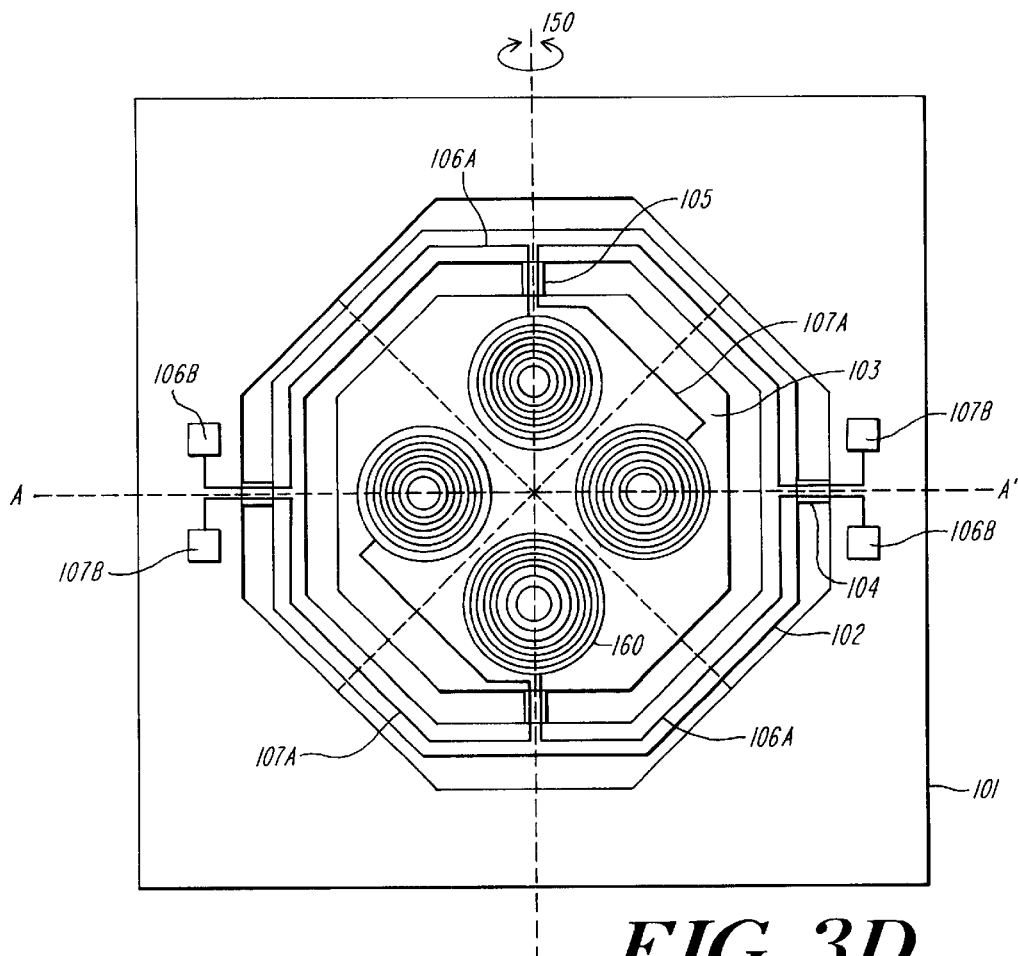
FIG. 3D shows a schematic illustration of an embodiment of a two-axis magnetically actuated device.
Figure 3E:
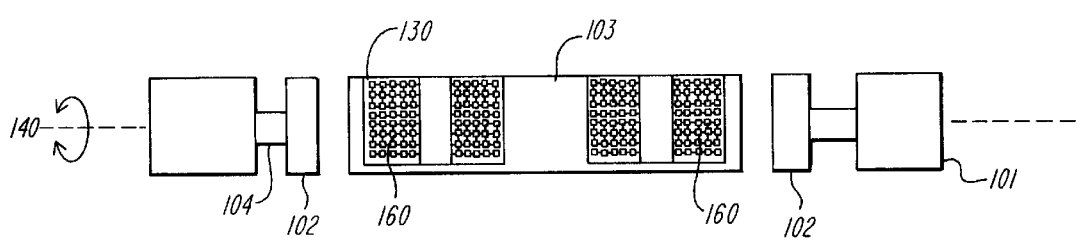
FIG. 3E shows a cross sectional schematic illustration of the embodiment of the two-axis magnetically actuated device of FIG. 3D along section A–A'.

Referring to FIGS. 3C and 3E, illustrative cross sections of other embodiments of a two-axis magnetically actuated device are shown. The device comprises a base member 101 and a first rotational member 102 suspended by a first set of torsional flexures 104 which connect the base member 101 and the first rotational member 102. The first set of torsional flexures 104 substantially define a first axis 140 about which the first rotational member 102 and a second rotational member 103 may rotate. The second rotational member is suspended by a second set of torsional flexures 105 which are connected to the first rotational member 102. The second set of torsional flexures 105 substantially define a second axis 150 about which the second rotational member 103 may rotate. Coils 160, formed from wound wire, are incorporated into recesses 130 in the second rotational member. In one embodiment, the wire diameter is from about 0.02 mm to about 1 mm in diameter. Preferably, the wire diameter is from about 0.1 mm to about 0.5 mm in diameter. In addition to ease of fabrication, use of wound wire to form coils permits generation of greater magnetic moments; and as a result, fabrication of a two-axis magnetically actuated device with a second rotational member on the order of 1 cm².

Referring to FIG. 3C, in one embodiment, the second rotational member is comprised of an upper member 103A and a lower member 103B. In one embodiment, the base member 101, first rotational member 102, second rotational member 103 and torsional flexures 104, 105, are micromachined from a monolithic SOI wafer and coils 160 formed from wound wire that are incorporated into the inner rotational member. Referring to FIGS. 3D and 3E, in another embodiment, the base member 101, first rotational member 102, second rotational member 103 and torsional flexures 104, 105 are machined, molded and/or stamped from a combination of plastic, metal, silicon, and/or ceramic components. For example, suitable metals include beryllium, copper, aluminum and alloys thereof. In addition, suitable flexure materials for this embodiment include, but are not limited to, silicon, beryllium-copper alloy, and spring materials known in the art. The lead lines 106A, 107A and contacts 106B, 107B may comprise any suitable conductive material, including, but not limited to Cu, Ag, Au, Ni, Pt, and alloys thereof. The lead lines 106A, 107A and contacts 106B, 107B may comprise plated metal, thin film metal and/or wire.

In one embodiment the specific dimensions of a two-axis magnetically actuated device are on the order of those of a micromechanical device. In one embodiment, a two-axis magnetically actuated micromechanical device is comprised of a base member with outer dimensions of about 800×800 μm, a first rotational member with outer dimensions of about 550×550 μm, and a second rotational member with outer dimensions of about 400×400 μm. The base member is composed of a SOI material comprising an approximately 1 μm thick silicon dioxide layer sandwiched between a first layer of silicon and a second layer of silicon, the first layer of silicon being in the range of 5 to 100 μm thick, and the second layer of silicon being in the range 300 to 600 μm thick. The first and second rotational members are composed of an insulator layer disposed between a dielectric layer and a silicon layer. Preferably, the insulator layer is either an approximately 0.1 to 1 μm thick silicon dioxide layer or an approximately 1 to 3 μm thick polyimide layer. The second rotational member further comprises a surface treatment disposed on the surface of the silicon layer and coils and lead lines disposed on the dielectric layer. The surface treatment is composed of a titanium tungsten alloy (Ti—W) adhesion layer approximately 100 to 1000 Å thick disposed on the silicon layer surface and an approximately 1000 Å thick gold (Au) layer disposed on the Ti—W adhesion layer. In such an embodiment, the Au layer is sufficiently thick to serve as a mirror.

In this embodiment, the first set of torsional flexures span an approximately 50 to 500 μm gap between the base member and first rotational member while the second set of torsional flexures span an approximately 50 to 500 μm gap between the first rotational member and second rotational member. The first and second sets of torsional flexures are composed of the same layers of materials as those of the first and second rotational members. The first and second sets of torsional flexures may be of approximately the same thickness as the first and/or second rotational members or of a substantially different thickness. Coils and lead lines are disposed on the dielectric layer of the first rotational member, second rotational member, and/or torsional flexures. The coils and lead lines are preferably comprised of a Ti—W adhesion layer approximately 100 to 1000 Å thick disposed on the dielectric layer of a rotational member or torsional flexure and a copper (Cu) layer approximately 5 μm thick disposed on the adhesion layer. The coils and lead lines are approximately 1 to 10 μm wide and spaced approximately at least 2 μm apart. It is to be realized that the width and spacing of the coils and lead lines is determined by the operational voltage and current desired for the device. For example, it is typically desirable to minimize the operational current. Consequently, it is desirable to minimize the width and spacing of the coils to thereby maximize the number of coil turns and, as a result, maximize the magnetic moment generated for a given current. The narrower the coils, however, the higher their resistance and as a result the greater the voltage required for a given current. The closer the spacing, the higher the likelihood of a short. Accordingly, coil and lead line width and spacing are primarily determined by these competing design factors. Preferably, for a device with an operational voltage of approximately 1 V, the coils and lead lines are approximately 5 μm wide and spaced approximately 5 μm apart. In one embodiment, the contacts are composed of the same layers of materials of approximately the same thickness as those of the coils and lead lines, however, it is to be understood that the precise width and thickness of the contacts is not central to the invention. The contacts are preferably disposed on a dielectric and/or insulator layer that in turn is disposed on a surface of the base member.

Figure 4A:
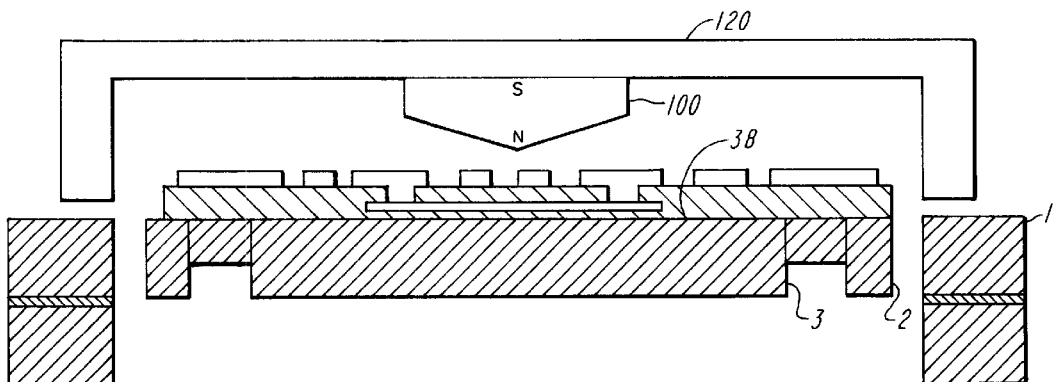
FIGS. 4A–4B show schematic cross sectional illustrations of various embodiments of a two-axis magnetically actuated device comprising a magnet and at least one pole piece.
Figure 4B:
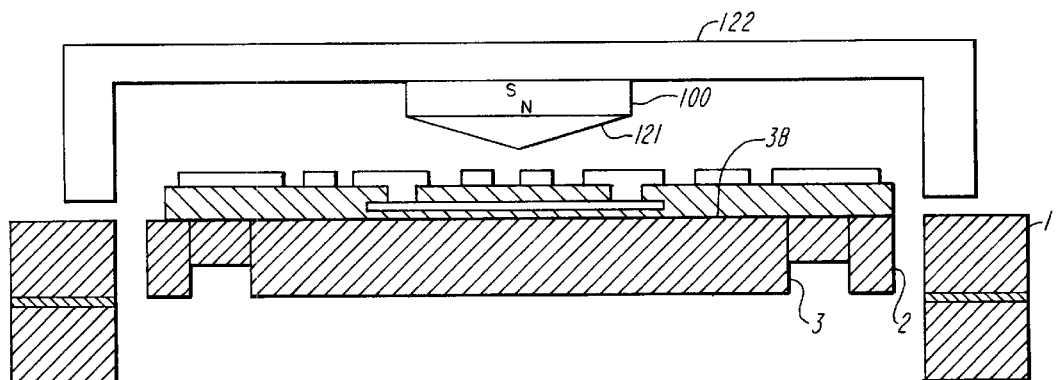

Referring to FIGS. 4A–4B, an illustrative cross section of two embodiments of a two-axis magnetically actuated device of the invention comprising a magnet and at least one pole piece are shown. In one embodiment, a two-axis magnetically actuated device further comprises a magnet 100 and, referring to FIG. 4A, a pole piece 120, or, referring to FIG. 4B, a first pole piece 121, and a second pole piece 122. The poles of the magnet 100 are represented by the conventional symbols N and S. The magnet 100 may be a permanent magnet or an electromagnet; the pole piece 120, and pole pieces 121, 122, are comprised of a soft magnetic material. Suitable soft magnetic materials include, but are not limited to, ferromagnetic materials such as soft iron, nickel-iron alloys such as permalloys, various forms of iron (Fe), steel, cobalt (Co), nickel (Ni) and various alloys thereof. Preferably, the magnet 100 and pole piece 120 are shaped and positioned to favor locating the region of the external magnetic field with the greatest field gradient substantially at the surface 3B. As shown by Equation 1, the higher the magnetic field gradient, the greater the force exerted by the interaction of the coil produced magnetic moment and the external magnetic field. Correspondingly, the greater the magnetic field gradient, the lower the current required to produce a given force and, as a result, the lower the voltage required to produce a rotational movement of a rotational member.

Figure 4C:
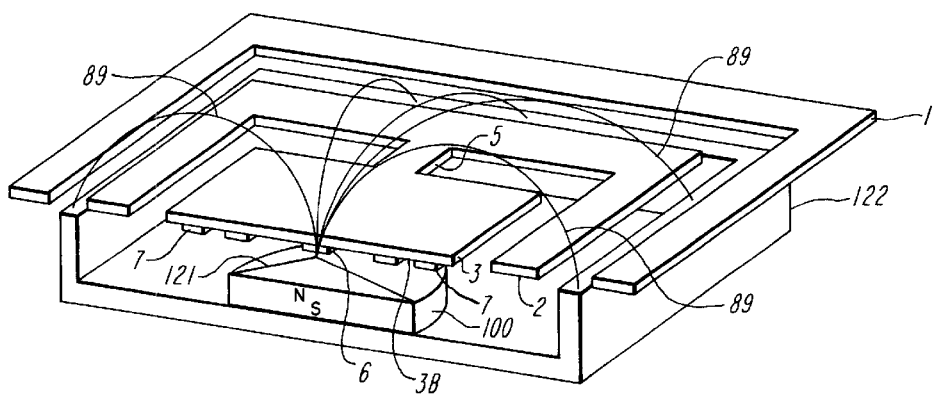
FIG. 4C shows a schematic three-dimensional cross sectional illustration of an embodiment of a two-axis magnetically actuated device comprising a magnet and two pole pieces.

Referring to FIG. 4C, a schematic three-dimensional cross sectional illustration of an embodiment of a two-axis magnetically actuated device comprising a magnet 100 and two pole pieces 121, 122, is shown. The associated magnetic field is represented by the lines 89, while the poles of the magnet 100 are represented by the conventional symbols N and S. The magnet 100 is positioned with one pole directed towards the side 3B of the second rotational member 3, the pole piece 121 is mounted on the magnet 100 between the magnet 100 and surface 3B. The pole piece 122 is mounted on the pole of magnet 100 directed away from the surface 3B. The pole pieces 121 and 122 are shaped and positioned to favor locating the region of the greatest field gradient substantially at the surface 3B. In one embodiment, the pole piece 121 is conical and positioned proximate to the coil pairs 6, 7 to increase the magnetic field gradient at the surface 3B. Preferably, as illustrated in FIG. 4C, the pole piece 122 is positioned proximate to the periphery of the first rotational member 2 to increase the magnetic field gradient between the pole pieces 121 and 122.

Figure 4D:
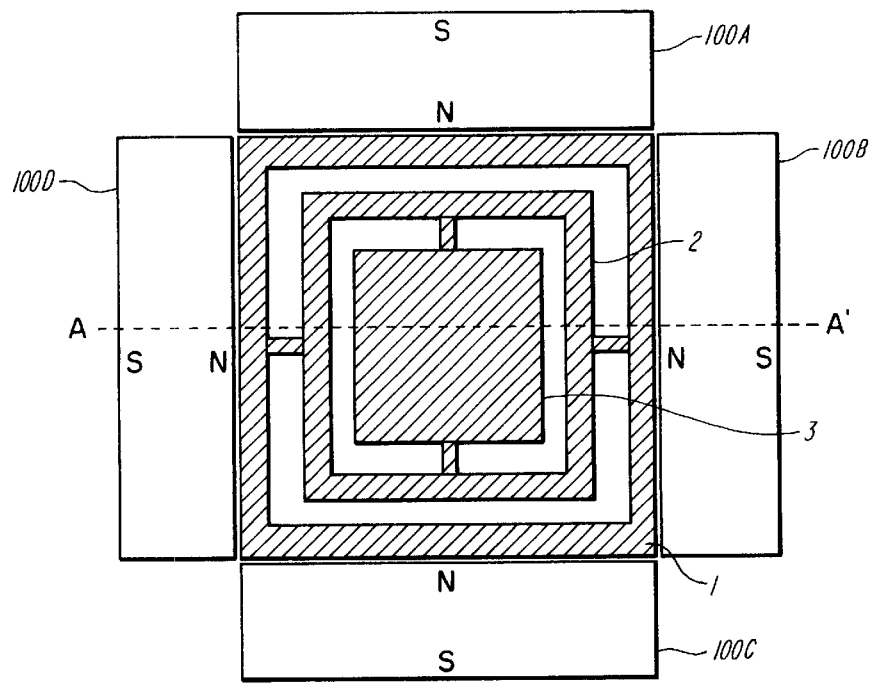
FIG. 4D shows a schematic illustration of an embodiment of a two-axis magnetically actuated device comprising multiple magnets.
Figure 4E:
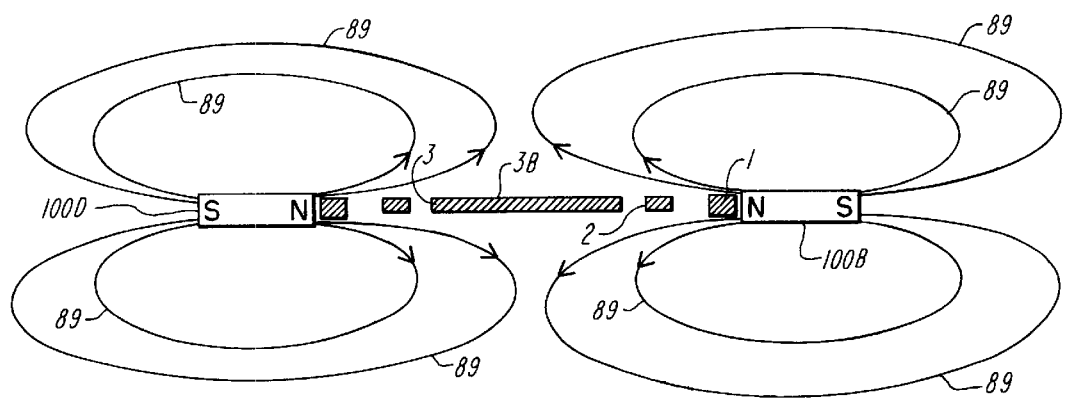
FIG. 4E shows a cross sectional schematic illustration of the embodiment of a two-axis magnetically actuated device of FIG. 4D along section A–A'.

Referring to FIGS. 4D–E, a schematic illustration of an embodiment of a two-axis magnetically actuated device comprising multiple magnets is shown. FIG. 4E shows a schematic cross sectional illustration of the device of FIG. 4D. The device of FIGS. 4D–4E is comprised of multiple magnets 100A, 100B, 100C, and 100D. The associated magnetic field is represented by lines 89, while the poles of the magnets 100A to 100D are represented by the conventional symbols N and S. The magnets 100A–100D are positioned peripherally about the base member 1 each with the same pole directed towards the second rotational member 3. The magnets 100A to 100D are shaped and positioned to favor locating the region of the greatest field gradient substantially at the surface 3B. In one embodiment, the magnets 100A to 100D are bar magnets. Preferably, as illustrated in FIGS. 4D–4E, the magnets 100A to 100D are positioned proximate to the periphery of the base member 1 to increase the magnetic field gradient generated at the surface 3B.

Figure 5:
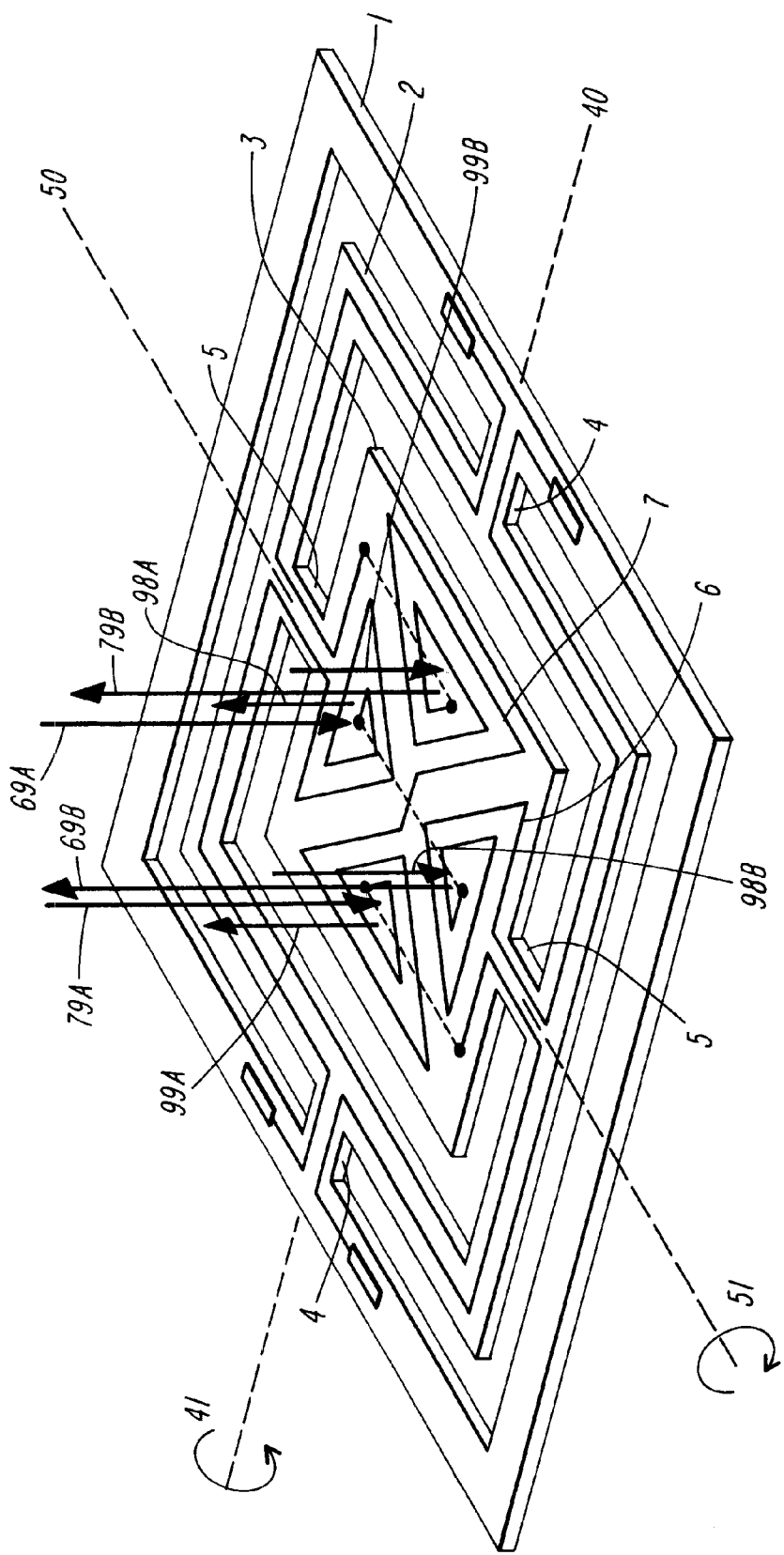
FIG. 5 shows a schematic illustration of a principle of operation of an embodiment of a two-axis magnetically actuated device.

Referring to FIG. 5, the principals of operation of one embodiment of a two-axis magnetically actuated device are shown. Application of a current to the coil pair 7 generates a pair of magnetic moments represented by the arrows 79A and 79B. The magnetic moments 79A, 79B interact with a magnetic influence, such as an external magnetic field, to generate a pair of forces, represented by the arrows 99A and 99B, on the second rotational member 3. It is not critical to the invention whether the magnetic moments 79A, 79B and/or forces 99A, 99B are equal or unequal. The forces 99A, 99B act in a "push-pull" fashion to induce a rotational movement in a direction 51 about the axis 50 and thereby produce an angular deflection of the second rotational member 3. Rotational movement of the first rotational member 2 and second rotational member 3 about the axis 40 may be initiated by application of a current to the coil pair 6 to generate a pair of magnetic moments, represented by the arrows 69A and 69B, which via interaction with an external magnetic field generate forces, represented by the arrows 98A, 98B, which act to produce a rotational movement in a direction 41. Rotational movements about the axes 40 and 50 may be executed serially, substantially simultaneously, or a rotational movement about one axis may be initiated before that about another axis is complete. It is to be realized that reversing the direction of current flow in the coil pair 7 reverses the direction of the forces 99A, 99B and thus, reverses the direction of rotational movement of the second rotational member 3 about the axis 50. Likewise it is to be realized that reversing the direction of current flow in the coil pair 6 reverses the direction of the forces 98A, 98B and thus reverses the direction of rotational movement of the first and second rotational members about the axis 40.

The degree of angular deflection of a rotational member (s) about an axis is determined by the restoring force of the associated torsional flexures and the forces generated by the associated magnetic moment-magnetic field interactions. For example, the angular deflection of the second rotational member 3 about the axis 50 is determined by the restoring force of the torsional flexures 5 and the forces 99A, 99B, generated by the interaction of the magnetic moments 79A, 79B, with the external magnetic field. Removal of the current and/or magnetic field gradient eliminates the forces 99A, 99B; as a result, the second rotational member 3 is substantially restored to its original position by the restoring force of the torsional flexures 5.

It is to be understood that it is not critical to the invention whether a rotational movement/deflection of a rotational member, 2 and/or 3, is initiated by application of a current to a coil pair, provision of a non-uniform external magnetic field, or substantially simultaneous application of a current and non-uniform external magnetic field. Further, it is to be realized that provision of a non-uniform external magnetic field may be accomplished, for example, by changing a substantially uniform field to a non-uniform field. The external magnetic fields, and as a result the magnetic influences, may derive from a single magnetic source or multiple magnetic sources. One embodiment of a single magnetic source suitable for the invention comprises a magnet 100 such as illustrated in FIGS. 4A and 4B. One embodiment, of multiple magnetic sources suitable to the invention comprises four magnets 100A to 100D, as illustrated in FIGS. 4D–4E.

Figure 6A:
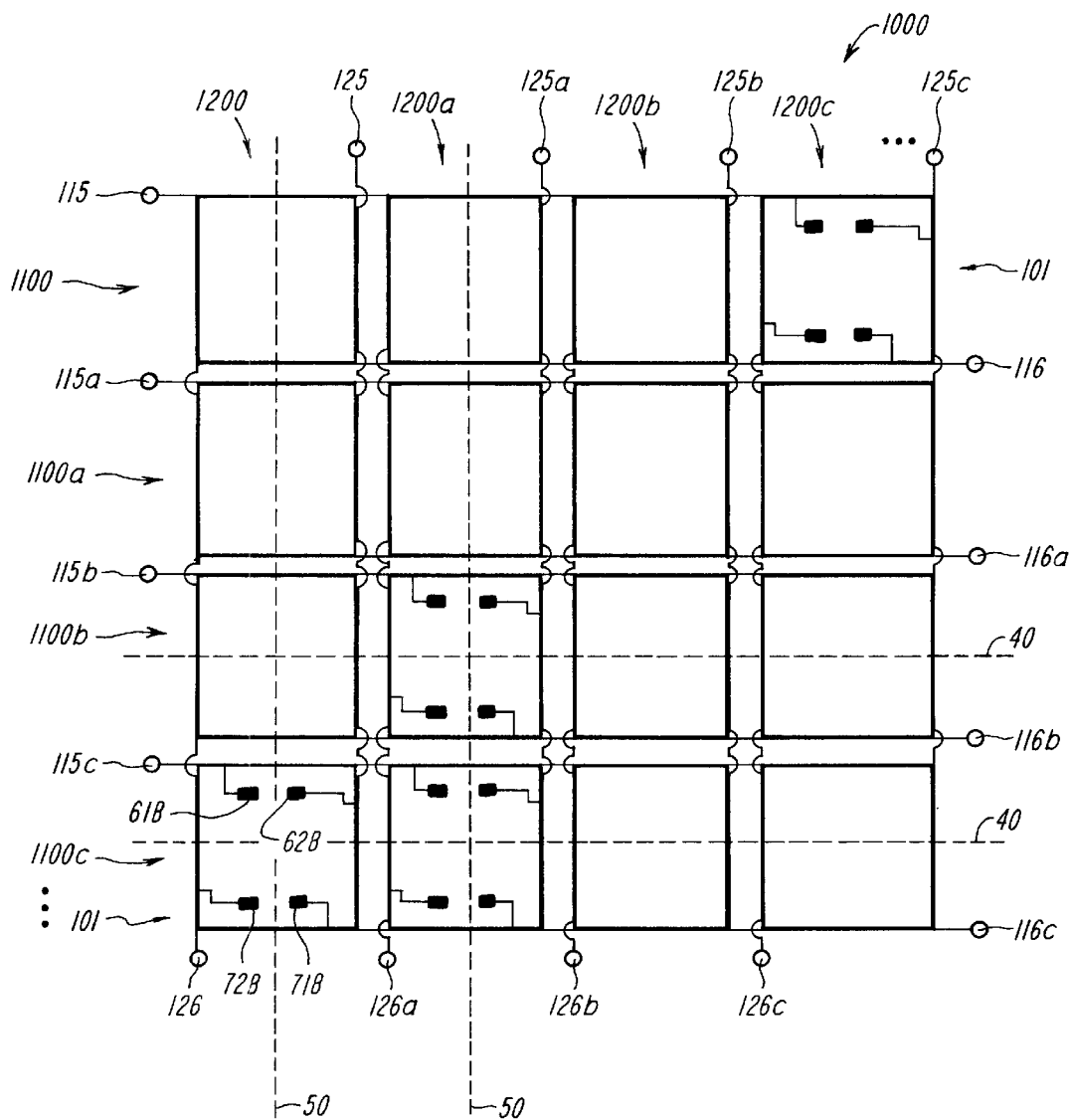
FIGS. 6A–6B show schematic illustrations of various embodiments of an array of multi-axis magnetically actuated devices.

Referring to FIG. 6A, one embodiment of an array of multi-axis magnetically actuated devices is shown. For purposes of illustration a 4×4 array is shown, however, it is to be realized that the invention is scalable to much higher array dimensions. A plurality of multi-axis magnetically actuated devices 101 are combined in an array 1000 comprised of rows 1100, 1100a, 1100b, etc. and columns 1200, 1200a, 1200b, etc. of devices 101. Each row has its own terminals 115, 115a, 115b, etc. and 116, 116a, 116b, etc. electrically connected to the contacts 61B and 71B, respectively, of each device 101 in the respective row. Each column has its own terminals 125, 125a, 125b, etc. and 126, 126a, 126b, etc., electrically connected to the contacts 62B and 72B, respectively, of each device 101 in the respective column. Rotational movement of a specific device 101 about a specific axis, 40 or 50, is accomplished by addressing the appropriate row and appropriate column terminal of that specific device. For example, to produce a rotational movement of the first and second rotational members of the device at row 1100b, column 1200a, about the axis 40, a potential difference is applied between the terminals 115b and 125a. As a result, a current is applied to the coil pair 6 of the device at row 1100b, column 1200a, that via interaction with a magnetic influence, such as an external magnetic field, produce a rotational movement of the first and second rotational members of the device at row 1100b, column 1200a, about the axis 40. Similarly, to produce a rotational movement of the second rotational member of the device at row 1100b, column 1200a, about its axis 50, a potential difference is applied between the terminals 116b and 126a thereby applying a current to coil pair 7 that via interaction with a magnetic influence produces the rotational movement about the axis 50.

Figure 6B:
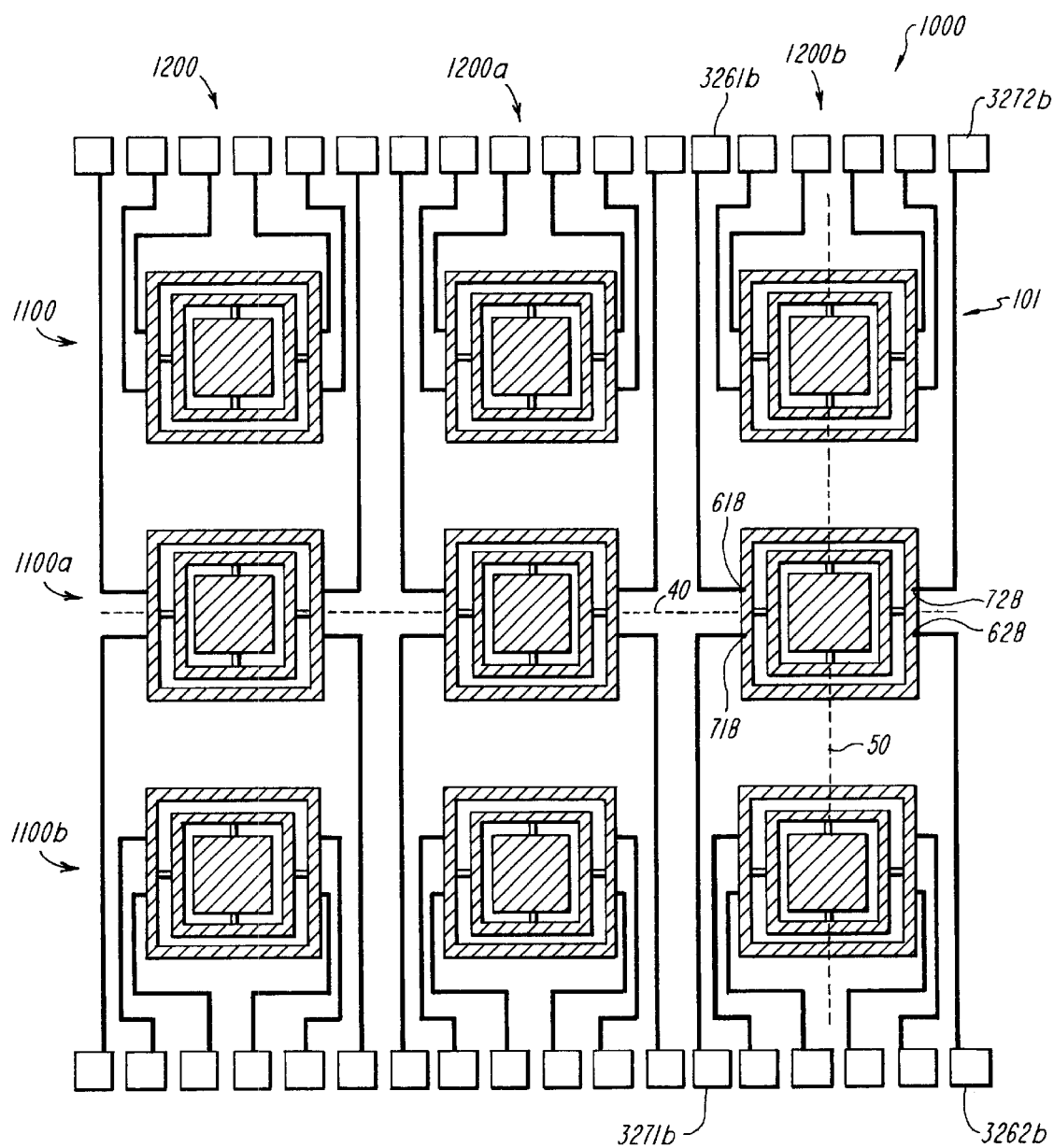

Referring to FIG. 6B, another embodiment of an array of multi-axis magnetically actuated devices is shown. For purposes of illustration a 3×3 array is shown, however, it is to be realized that the invention is scalable to much higher array dimensions. A plurality of multi-axis magnetically actuated devices 101 are combined in an array 1000 comprised of rows 1100, 1100a, 1100b, etc. and columns 1200, 1200a, 1200b, etc. of devices 101. Each device 101 in the array has four connections, one for each of the contacts 61B, 62B, 71A and 71B, respectively, of each device 101. It is to be understood that the provision of a separate connection for each contact enables each device 101 of the array to be actuated and controlled both independently and simultaneously. Rotational movement of a specific device 101 about a specific axis, 40 or 50, is accomplished by addressing the appropriate connections of that specific device. For example, to produce a rotational movement of the first and second rotational members of the device at row 1100a column 1200b, about the axis 40, a potential difference is applied between the connections 3261b and 3262b. As a result, a current is applied to the coil pair 6 of the device at row 1100a, column 1200b, that via interaction with a magnetic influence, such as an external magnetic field, produce a rotational movement of the first and second rotational members of the device at row 1100a, column 1200b, about the axis 40. Similarly, to produce a rotational movement of the second rotational member of the device at row 1100a, column 1200b, about its axis 50, a potential difference is applied between the terminals 3271b and 3272b thereby applying a current to coil pair 7 that via interaction with a magnetic influence produces the rotational movement about the axis 50.

Although FIGS. 6A and 6B illustrate a regular square pattern array of multi-axis magnetically actuated devices, other array patterns are contemplated by the invention. Other array patterns include, but are not limited to, off-set square patterns, FIG. 6C, hexagonal patterns, FIG. 6D, triangular patterns, FIG. 6E, and "irregular" patterns, FIG. 6F. Further, row and column addressing schemes analogous to those described above for a regular square pattern array may be employed for off-set square, hexagonal, triangular, and even irregular array patterns.

Figure 7A:
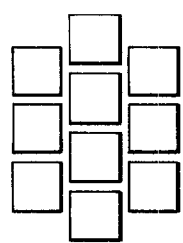
FIGS. 7A–7B show schematic illustrations of various embodiments of an optical switch comprised of a multi-axis magnetically actuated device.
Figure 7A:
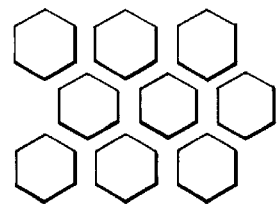
Figure 7A:
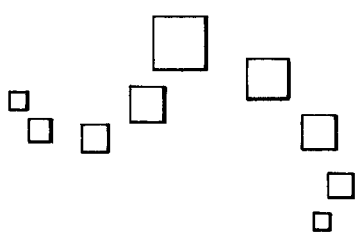
Figure 7A:
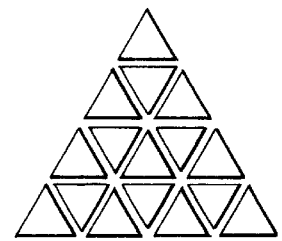
Figure 7A:
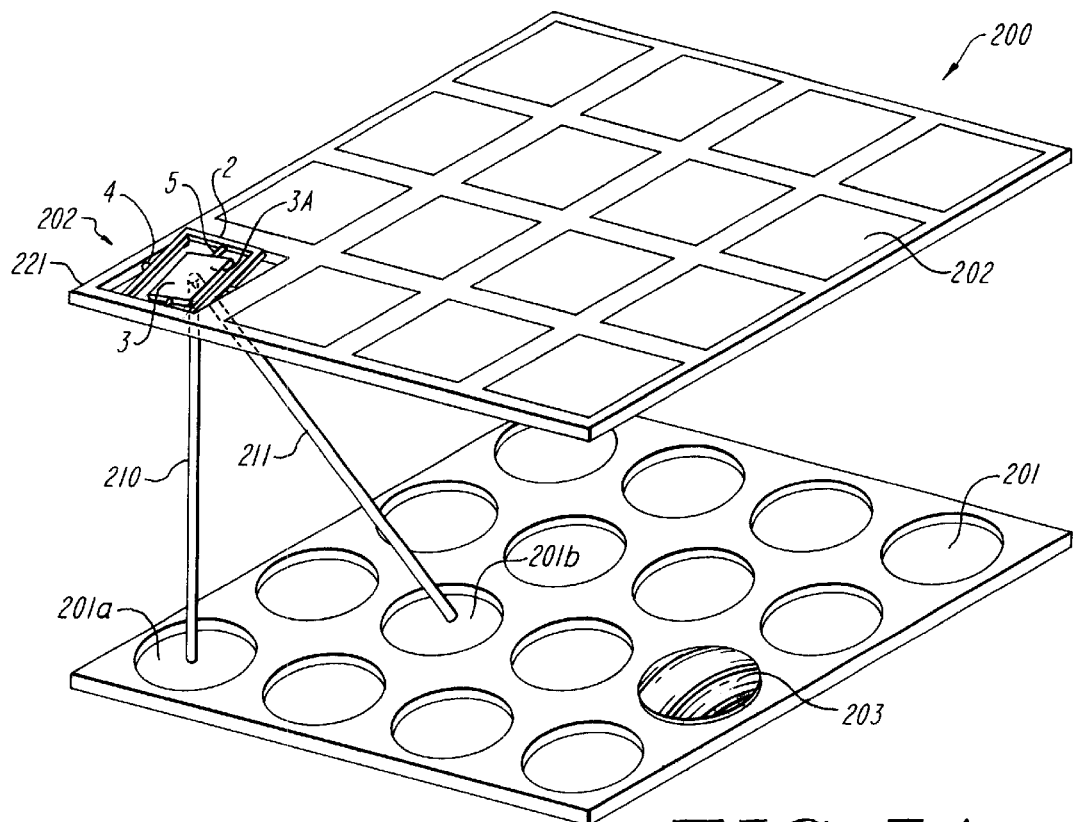

The invention also provides an optical switch comprised of a multi-axis magnetically actuated device. Referring to FIG. 7A, one embodiment of an N×N optical matrix switch comprised of an array of two-axis magnetically actuated micromechanical reflectors of the invention is shown. For purposes of illustration a 4×4 matrix switch is shown, however, it is to be realized that an optical matrix switch of the invention is scalable to much higher matrix dimensions. The optical switch 200 comprises an N×N array of ports 201, adapted to receive a suitable optical wave-guide, such as an optical fiber, and switching elements 202 each comprising a two-axis magnetically actuated micromechanical reflector. In operation, an input optical signal, such as represented by the ray 210, is reflected by a switching element 202 to establish an output optical signal, such as represented by the ray 211. The two-axis structure of the switching elements 202 enable an input signal to be output, or switched, to any of the plurality of ports 201 by simply reflecting the optical signal. No optical-to-electrical signal conversion is required; and, no optical signal polarization is required. The ports 201, however, may further include a lens 203 to facilitate the collimation and/or matching of an optical signal in to or out of a port 201.

The switching elements 202 are each comprised of a second rotational member 3, having a reflective surface 3A that reflects an input optical signal. The second rotational member 3 is mounted by a second set of torsional flexures 5 on a first rotational member 2 which in turn is mounted by a first set of torsional flexures 4 on a base member 221. Preferably, the base member 221 comprises a single structure adapted to serve as a base member for each of the plurality of switching elements 202, however, the base member 221 may serve as a base member for only a portion of the switching elements 202. Switching of an input signal 210 is accomplished by addressing the appropriate switching element 202 associated with the port 201 which is the source of the input signal 210. For example, to switch an optical signal from the port 201a to the port 201b, the switching element 202a is addressed by application of a current to coil pairs, not shown in FIG. 7A, on the second rotational member of the element 202a, that via interaction with a magnetic influence, such as an external magnetic field, produce a rotational movement of the first and second rotational members of the element 202a to reflect the input signal 210 along output the path 211 to the port 201b.

Figure 7B:
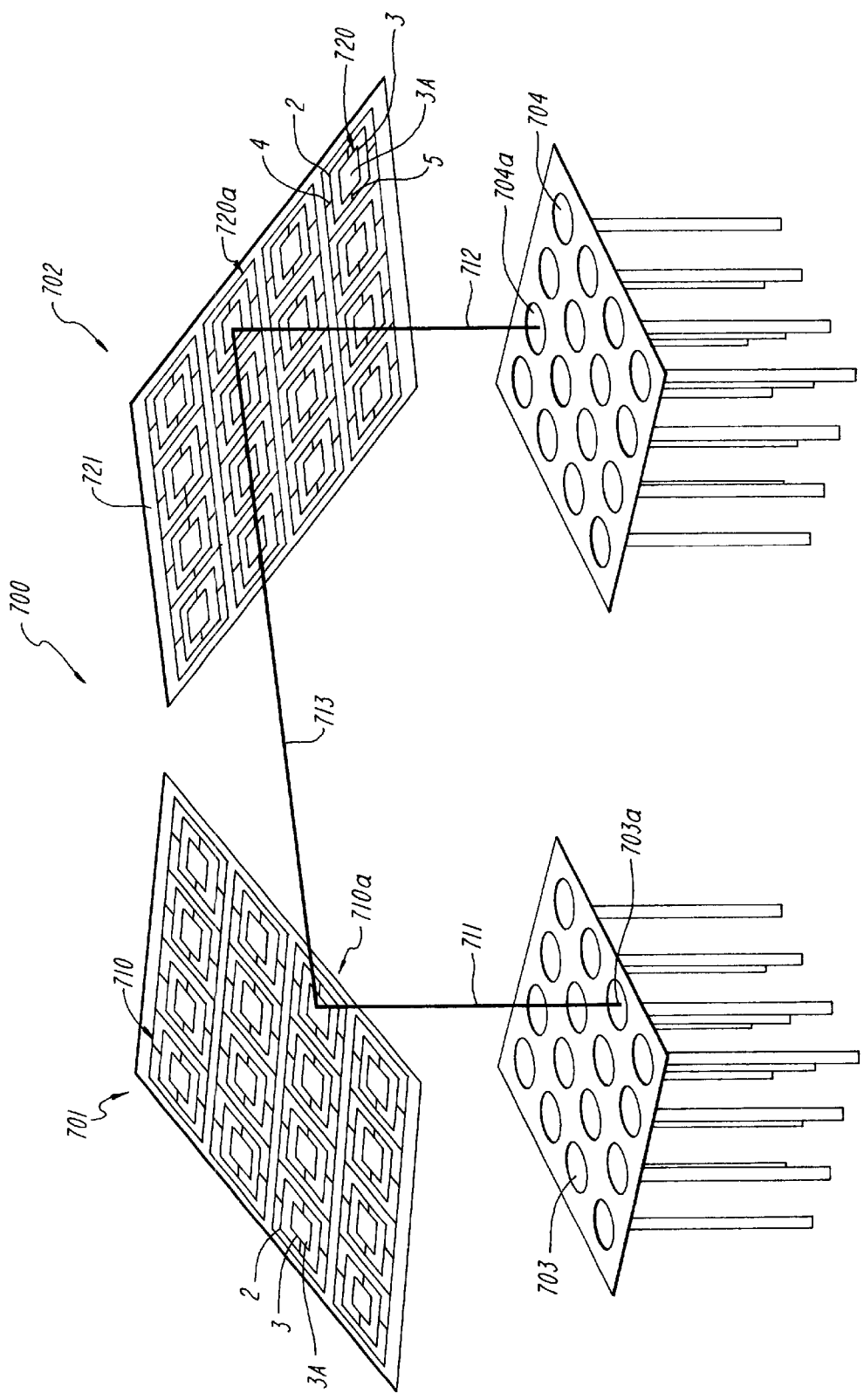
Figure 8:
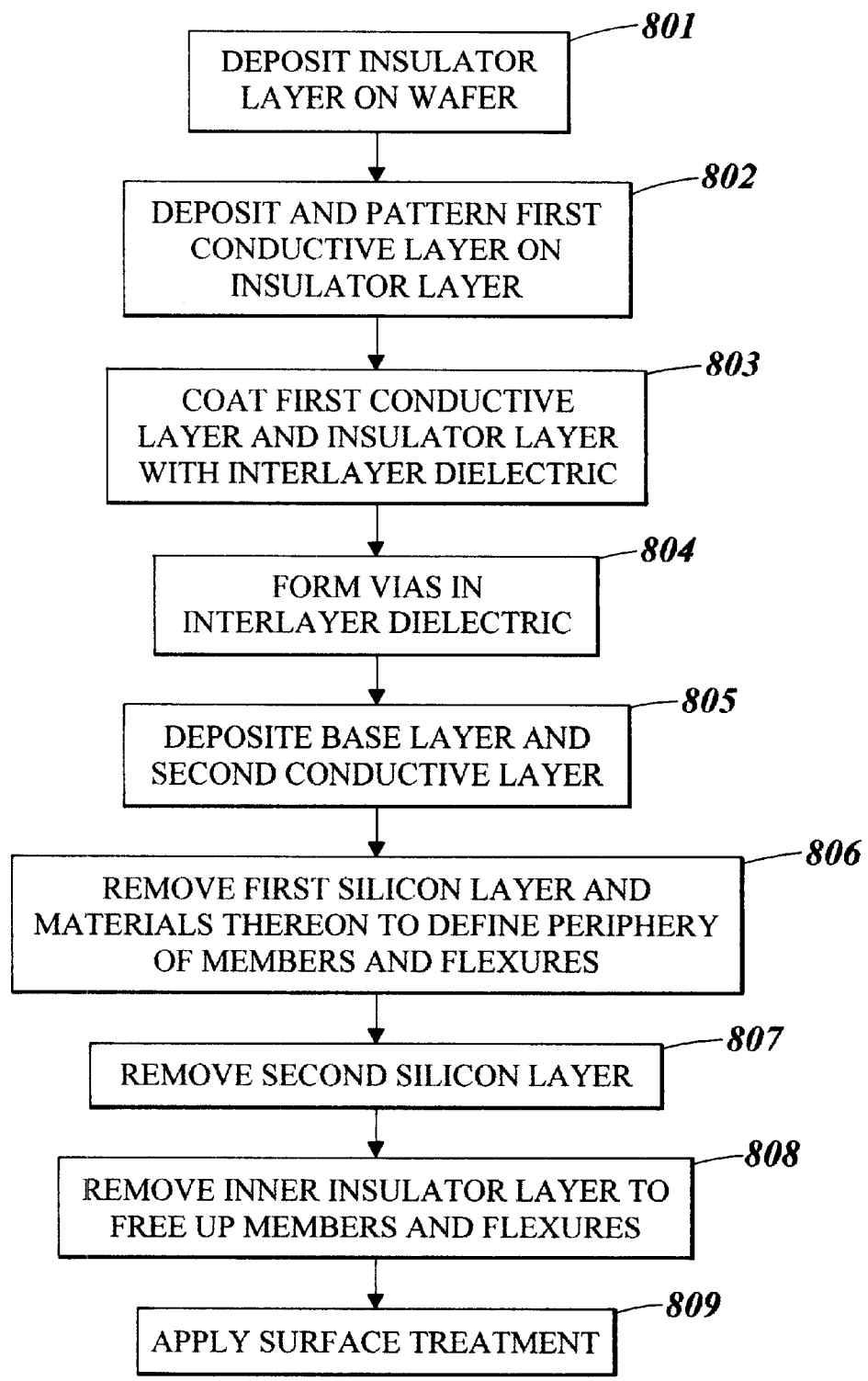
FIG. 8 is a diagram illustrating an embodiment of a method of fabricating a multi-axis magnetically actuated device.

Referring to FIG. 7B, another embodiment of an N×N optical matrix switch 700 comprised of an input array of two-axis magnetically actuated micromechanical reflectors 701 and an output array of two-axis magnetically actuated micromechanical reflectors 702 of the invention is shown. For purposes of illustration a 4×4 input matrix and 4×4 output matrix switch is shown, however, it is to be realized that an optical matrix switch of the invention is scalable to much higher matrix dimensions. The optical switch 700 comprises an N×N array of input ports 703 and an array of output ports 704, each adapted to receive a suitable optical wave-guide, such as an optical fiber, and switching elements 710 and 720 each comprising a two-axis magnetically actuated micromechanical reflector. In operation, an input optical signal, such as represented by the ray 711, is reflected by an input switching element 710 to an output switching element 720 to establish an output optical signal, such as represented by the ray 712. The two-axis structure of the switching elements 710 and 720 enable an input signal to be output, or switched, to any of the plurality of output ports 704 by simply reflecting the optical signal. No optical-to-electrical signal conversion is required; and, no optical signal polarization is required. The ports 703 and 704, however, may further include a lens to facilitate the collimation and/or matching of an optical signal in to or out of a port.

The switching elements 710 and 720 are each comprised of a second rotational member 3, having a reflective surface 3A that reflects an input optical signal. The second rotational member 3 is mounted by a second set of torsional flexures 5 on a first rotational member 2 which in turn is mounted by a first set of torsional flexures 4 on a base member 721. Preferably, the base member 721 comprises a single structure adapted to serve as a base member for each of the plurality of switching elements on a given input and/or output array. The base member 721, however, may serve as a base member for only a portion of the switching elements on a given array. Switching of an input signal 711 is accomplished, for example, by addressing the appropriate input switching element 710 associated with the input port 703 which is the source of the input signal 711. For example, to switch an optical signal from the input port 703a to the output port 704a, the switching element 710a is addressed by application of a current to coil pairs, not shown in FIG. 7B, on the second rotational member of the element 710a, that via interaction with a magnetic influence, such as an external magnetic field, produce a rotational movement of the first and/or second rotational members of the element 710a to reflect the input signal 711 along the path 713 to output switching element 720a. Output switching element 720a is similarly addressed by application of a current to coil pairs, not shown in FIG. 7B, on the second rotational member of the element 720a, that via interaction with a magnetic influence, such as an external magnetic field, produce a rotational movement of the first and/or second rotational members of the element 720a to reflect the input signal 711 along the output path 712 to the output port 704a.

It is to be realized that although switching of a single input signal has been illustrated, the optical switch of the invention is not limited to switching one input signal at a time, but rather that input signals from each input port 703 may be independently and simultaneously switched to one or more of the output ports 704. For example, provision of a separate connection for each contact of each two-axis magnetically actuated micromechanical reflector of an array, such as illustrated in FIG. 6B, enables each switching element of an array to be actuated and controlled both independently and simultaneously and, accordingly, enables input signals from each input port 703 to be independently and simultaneously switched to one or more output ports 704.

Further, although an N×N optical matrix switch has been shown, is it to be realized that the above description contemplates and encompasses 1×N and N×M optical matrix switches as well. As illustrated in FIGS. 7A and 7B, each port is primarily associated with a single switching element and each switching element with a single port. However, it is to understood that multiple ports may be associated with a switching element and/or multiple switching elements may be associated with a port. Such multiple port-switching element associations may be achieved, for example, by offsetting a regular square array of switching elements with respect to a regular square array of ports. Further, it is to be understood that the switching elements may further comprise a magnet and at least one pole piece such as, for example, illustrated in FIGS. 4A–4C. It is also to be understood that the switching elements may further comprise multiple magnets such as, for example, illustrated in FIGS. 4D–4E.

Referring to FIGS. 8 and 9A–9I, a method of fabricating a two-axis magnetically actuated device is illustrated. An insulator layer 310, preferably from about 0.1 to about 1 μm thick for silicon dioxide, silicon nitride or undoped silicon carbide insulator materials, and preferably from about 1 to about 3 μm thick for polymeric insulator materials such as polyimide, is spun or otherwise deposited, 801 and FIG. 9A, on a SOI wafer 300 that is ultimately etched to a thickness of from about 2 to 500 μm and preferably from about 20 to 50 μm. The SOI wafer is comprised of an inner insulator layer 304 sandwiched between a first silicon layer 302 and a second silicon layer 306. The inner insulator layer 304 is preferably comprised of a silicon dioxide layer from about 1 to 3 μm thick. Suitable insulator layer 310 materials include, but are not limited to, polyimide, silicon dioxide, silicon nitride, and doped silicon carbide. Subsequently, a first conductive layer 320 is deposited and patterned, 802 and FIG. 9B, on the insulator layer 310, preferably in a layer from about 0.2 to about 2 μm thick. The first conductive layer 320 serves as a connector for subsequently deposited coils and lead lines. Accordingly, the first conductive layer 320 preferably comprises a metal such as, for example, copper (Cu), silver (Ag), gold (Au), palladium (Pd), and/or nickel (Ni), but may also comprise, for example, conductive ceramics or polymers and/or films such as ITO and polyaniline. In addition, the first conductive layer preferably comprises an adhesion layer in contact with the insulator layer 310 on which a metal layer is deposited. Suitable adhesion layer materials include, but are not limited to, materials such as titanium (Ti), chromium (Cr), titanium-tungsten alloys (Ti—W), and vanadium-nickel alloys (V—Ni). Suitable techniques for deposition of the first conductive layer 320 and any associated adhesion layer, include, but are not limited to, evaporation, chemical vapor deposition (CVD), and sputtering, such as argon ion sputtering. Patterning of the first conductive layer 320 may be achieved, for example, by liftoff or etch techniques.

Figure 9A:
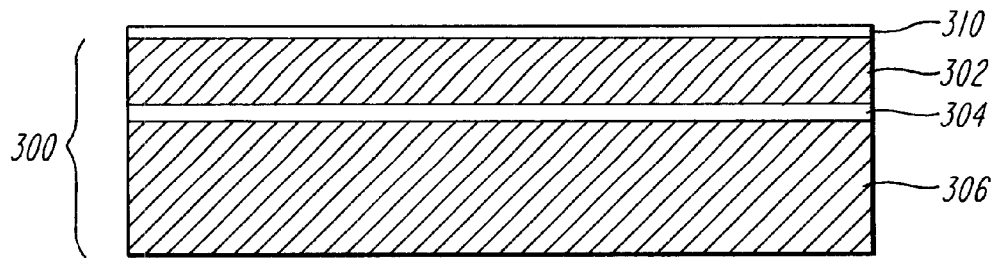
FIGS. 9A–9I show a series of cross sectional illustrations of an embodiment of a multi-axis magnetically actuated device fabricated by the method illustrated by FIG. 8.
Figure 9B:
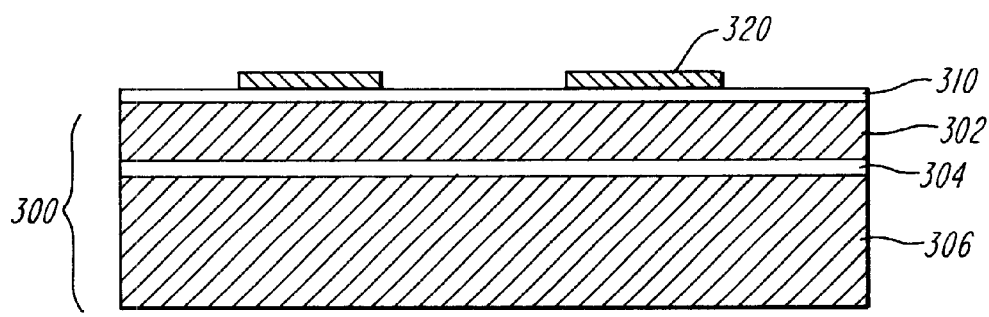
Figure 9C:
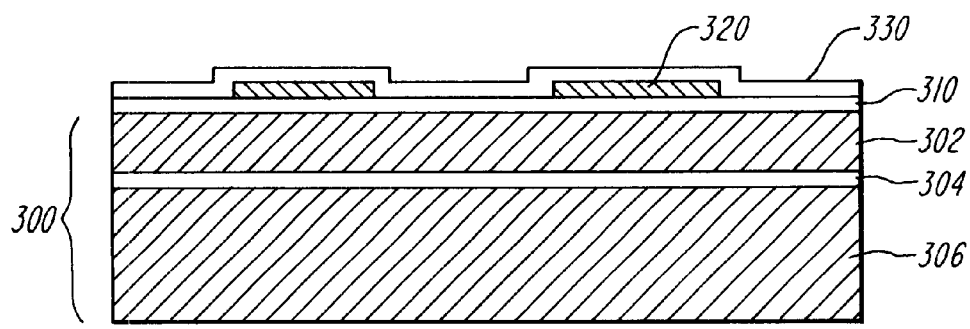
Figure 9D:
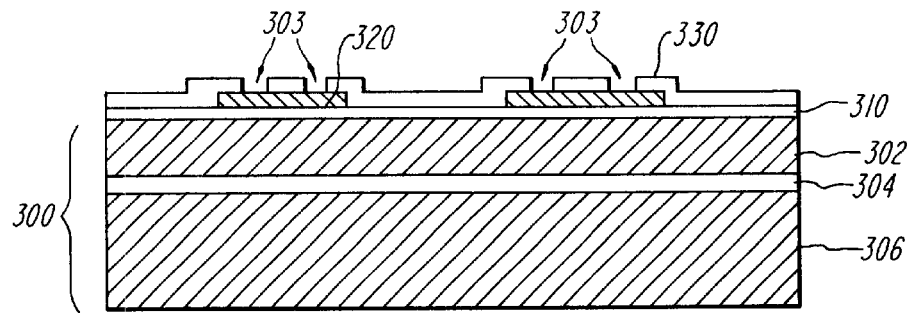
Figure 9E:
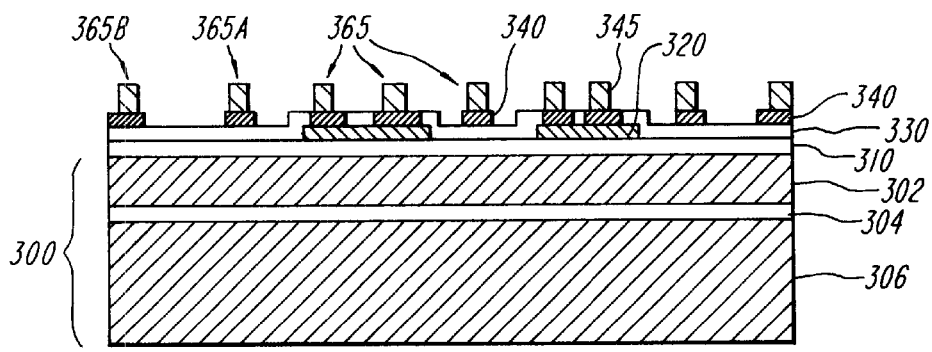
Figure 9F:
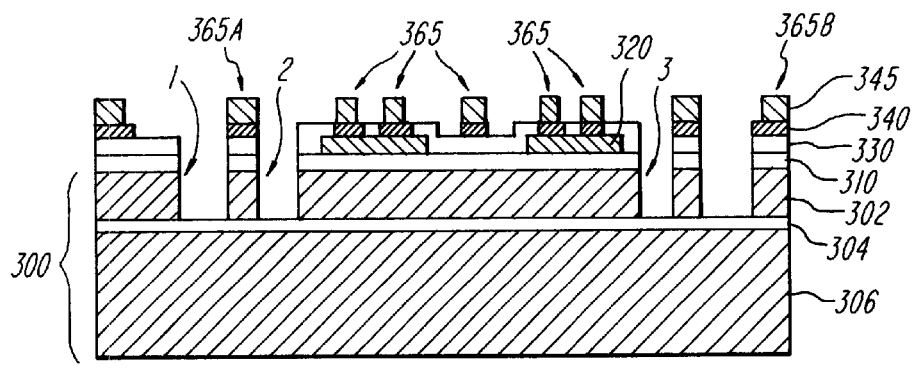
Figure 9G:
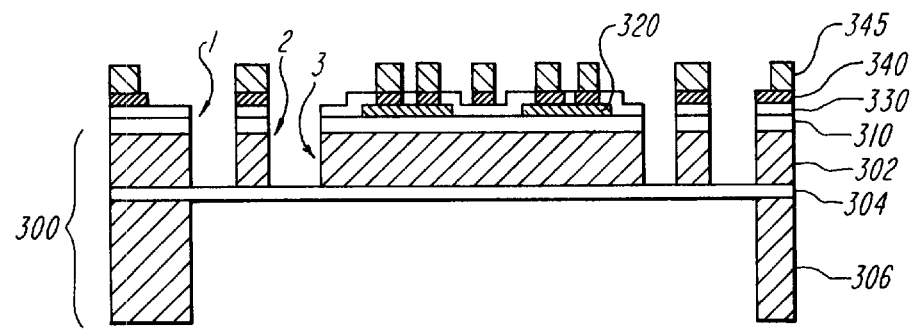
Figure 9H:
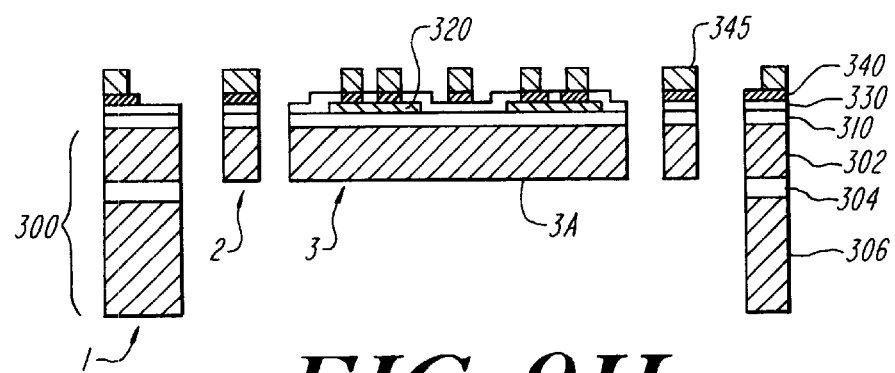

Next, the first conductive layer 320 and insulator layer 310 are coated, 803 and FIG. 9C, with an interlayer dielectric 330. Suitable interlayer dielectric materials include, but are not limited to, polyimide, silicon dioxide, and silicon nitride. Preferably, the interlayer dielectric 330 is from about 1 to about 3 μm thick and comprises a polymeric material such as polyimide, however, the interlayer dielectric 330 may consist of an about 0.1 to about 1 μm thick silicon dioxide, silicon nitride or undoped silicon carbide material. Vias 303 are made, 804 and FIG. 9D, in the interlayer dielectric 330, for example, by a suitable photolithography technique. In one embodiment, the photolithography technique first comprises coating the interlayer dielectric 330 with photoresist and exposing the photoresist to ultra-violet light through a mask. The portions of the photoresist exposed to ultra-violet are then removed, for example, by etching in a suitable developer for the photoresist, to expose portions of the interlayer dielectric 330. The exposed portions of the interlayer dielectric 330 are then removed, for example, by a plasma etch, to create vias 303 that expose portions of the first conductive layer 320 and/or insulator layer 310. The vias 303 are preferably from about 2 to about 10 μm wide and preferably spaced no closer than about 5 μm from edge to edge. A base layer 340 is then deposited onto the interlayer dielectric 330 and portions of the first conductive layer 320 exposed by the vias 303. A second conductive layer 345 is then deposited and patterned, 805 and FIG. 9E, onto the base layer 340 to form coils 365, lead lines 365A, and contacts 365B. Preferably, the coils, lead lines, and contacts are comprised of a metal conductor, such as copper (Cu), silver (Ag), gold (Au) and/or palladium (Pd), which is electroplated onto the base layer 340 in a photoresist layer from about 1 to about 10 μm thick and electroplated from about 2 to about 10 μm thick. The base layer 340 preferably comprises a material that functions as an adhesion layer and/or a diffusion barrier layer for the material that comprises the coils, lead lines, and contacts. For example, materials such as titanium (Ti), chromium (Cr), titanium-tungsten alloys (Ti—W), and vanadium-nickel alloys (V-Ni), can function as an adhesion layer, while materials such as platinum (Pt), Pd, and Ti—W can function as a diffusion barrier layer. Accordingly, Ti—W is a preferred base layer material. The base layer 340 is preferably deposited in a layer from about 100 Å to about 1000 Å thick. Suitable techniques for deposition of the base layer, coils, lead lines, and/or contacts include, for example, electroplating, evaporation, chemical vapor deposition (CVD), and sputtering, such as argon ion sputtering. It is to be realized, however, that soft magnetic materials, such as Ni, are typically difficult to sputter onto a substrate and that reactive materials, such as Ti, are typically difficult to electroplate.

Referring again to FIGS. 8 and 9A–9I, in one embodiment of process step 805, a base layer 340 of Ti—W, followed by Cu or Ni, is sputtered on to the interlayer dielectric 330 and portions of the first conductive layer 320 exposed by the vias 303. Next a photoresist layer is deposited over the base layer 340, masked and patterned, using any suitable photolithography technique, to create vias. The second conductive layer 345 is then deposited into these vias in the photoresist. Preferably, the second conductive layer comprises a metal conductor, such as Au, which is electroplated into the vias. Subsequently, the photoresist is removed and exposed portions of the base layer 340 are removed, for example, by etching. Following this, the base member, rotational members and flexures are fabricated, process steps 806 to 808 and FIGS. 9F–9H. A thick photoresist is coated onto the exposed portions of the interlayer dielectric 330, the first conductive layer 320, coils 365, lead lines 365A, and contacts 365B. The thick photoresist layer is patterned by a photolithography technique and portions of the photoresist removed to expose vias which define the periphery of the base member 1, the first rotational member 2, the second rotational member 3, and the first and second sets of torsional flexures (not shown in FIGS. 9A–9I). The material exposed by these vias is etched, 806 and FIG. 9F, to the inner insulator layer 304 of the SOI wafer 300, for example, by a plasma containing chlorine or fluorine, and the photoresist removed. The second silicon layer 306 is then etched, 807 and FIG. 9G, to the inner insulator layer 304, for example, by reactive ion etch or an inductively coupled plasma etch. Subsequently, the exposed portions of the inner insulator layer 304 are removed, 808 and FIG. 9H, for example, by an hydrofluoric acid (HF) etch, to free up the members and flexures.

Figure 9I:
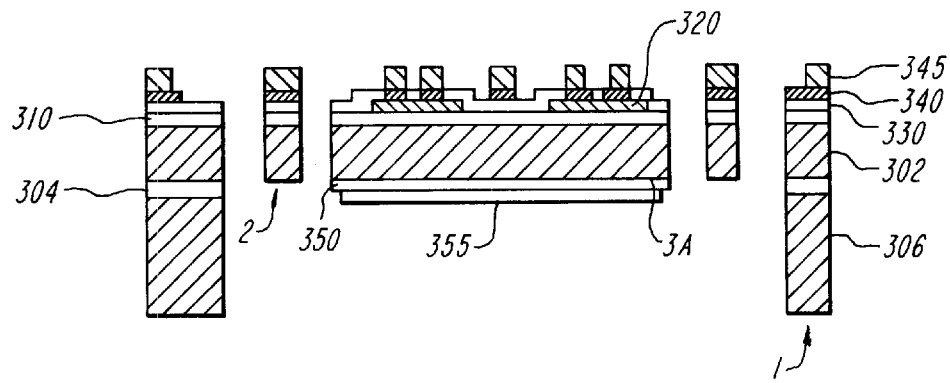

In one embodiment, a method of fabrication further includes application of a surface treatment, 809 and FIG. 9I, to a surface 3A of the second rotational member 3. For example, one surface treatment comprises deposition of an adhesion layer 350 on the surface 3A followed by deposition of a reflective metal layer 355, such as gold or aluminum, on the adhesion layer 350. Suitable adhesion layer 350 materials include, but are not limited to, those previously described. In another embodiment, the surface treatment comprises deposition of a thermal-stress compensation layer on the surface 3A followed by deposition of a reflective layer on the thermal-stress compensation layer. In another embodiment, the surface treatment comprises formation of a diffraction grating surface on the surface 3A.

While the invention has been particularly shown and described with reference to specific embodiments, it should be understood by those skilled in the art that various changes in form and detail may be made therein without departing from the spirit and scope of the invention as defined by the appended claims.

What is claimed is:

1. A multi-axis magnetically actuated device comprising,
a base member,
a first rotational member mounted to the base member and for rotational movement about a first axis,
a second rotational member having first and second opposing surfaces and being mounted to the first rotational member and for rotational movement about a second axis,
a first coil pair arranged adjacent to the first surface of the second rotational member and adapted to produce a rotational movement of the first and second rotational members about the first axis in response to interaction with a first magnetic influence, and
a second coil pair arranged adjacent to the first surface of the second rotational member and adapted to produce a rotational movement of the second rotational member about the second axis in response to interaction with a second magnetic influence.

2. The device of claim 1 wherein,
the first rotational member is mounted to the base member by a first pair of torsional flexures arranged on the first rotational member and the base member to permit rotational movement of the first and second rotational members about the first axis, and
the second rotational member is mounted to the first rotational member by a second pair of torsional flexures arranged on the second rotational member and the first rotational member to permit rotational movement of the second rotational member about the second axis.

3. The device of claim 2 wherein at least one of the first pair of torsional flexures and the second pair of torsional flexures comprises a material from the group consisting of silicon, polysilicon, silicon-on-insulator, silicon nitride and silicon carbide.

4. The device of claim 2 wherein at least one of the first pair of torsional flexures and the second pair of torsional flexures comprises nickel.

5. The device of claim 2 wherein at least one of the first pair of torsional flexures and the second pair of torsional flexures further comprises a polymer coating.

6. The device of claim 1 wherein the second surface of the second rotational member is reflective.

7. The device of claim 1 further comprising a surface treatment applied to the second surface of the second rotational member.

8. The device of claim 7 wherein the surface treatment comprises a multi-layer dielectric reflector.

9. The device of claim 7 wherein the surface treatment comprises at least one metal layer.

10. The device of claim 9 wherein the at least one metal layer is further adapted for reflection.

11. The device of claim 9 wherein the at least one metal layer is selected from the group consisting of aluminum, silver, gold, and alloys thereof.

12. The device of claim 9 wherein the at least one metal layer is arranged to compensate for thermal stress-induced curvature of the second rotational member.

13. The device of claim 7 wherein the surface treatment comprises a diffraction grating.

14. The device of claim 1 further comprising an intermediate medium disposed between at least one of the first coil pair and the second coil pair and the second rotational member.

15. The device of claim 14 wherein the intermediate medium comprises an insulative layer.

16. The device of claim 14 wherein the intermediate medium comprises a silicone rubber layer.

17. The device of claim 1 further comprising,
a magnet adjacent to the second rotational member and having a first and second opposing surfaces, and
a first pole piece adjacent to the first opposing surface of the magnet, wherein the magnet and the first pole piece are arranged to produce a magnetic field gradient between the first opposing surface and the second opposing surface of the second rotational member.

18. The device of claim 17 further comprising, a second pole piece adjacent to the second opposing surface of the magnet, wherein the magnet, the first pole piece, and the second pole piece are arranged to produce a magnetic field gradient between the first opposing surface and the second opposing surface of the second rotational member.

19. The device of claim 17 wherein the first pole piece comprises an iron-base alloy containing about 45 percent to about 80 percent nickel.

20. The device of claim 1 wherein the first and second magnetic influences derive from a single magnet source.

21. A method of actuating a multi-axis magnetically actuated device, the method comprising, applying a first electric current to a first coil pair arranged adjacent to a first surface of a second rotational member connected to a first rotational member to induce a rotational movement of the first and second rotational members about a first axis in response to interaction with a first magnetic influence, and applying a second electric current to a second coil pair arranged adjacent to the first surface of the second rotational member to induce a rotational movement of the second rotational member about a second axis in response to interaction with a second magnetic influence.

22. The method of claim 21 comprising, applying the second electric current to the second coil pair to induce a rotational movement of the second rotational member about the second axis and substantially orthogonal to the rotational movement about the first axis.

23. The method of claim 21 further comprising the step of deflecting an optical ray in response to at least one of the rotational movement of the first and second rotational members about the first axis and the rotational movement of the second rotational member about the second axis.

24. A method of fabricating a multi-axis magnetically actuated device, the method comprising, providing a base member, mounting a first rotational member to the base member for rotational movement about a first axis, mounting a second rotational member having first and second opposing surfaces to the first rotational member for rotational movement about a second axis, arranging a first coil pair adjacent to the first surface of the second rotational member adapted to produce a rotational movement of the first and second rotational members about the first axis in response to interaction with a first magnetic influence, and arranging a second coil pair adjacent to the first surface of the second rotational member adapted to produce a rotational movement of the second rotational member about the second axis in response to interaction with a second magnetic influence.

25. A device comprising, a plurality of multi-axis magnetically actuated devices arranged in an array, each of the multi-axis magnetically actuated devices having, a base member, a first rotational member mounted to the base member and for rotational movement about a first axis, a second rotational member having first and second opposing surfaces and being mounted to the first rotational member and for rotational movement about a second axis, a first coil pair arranged adjacent to the first surface of the second rotational member and adapted to produce a rotational movement of the first and second rotational members about the first axis in response to interaction with a first magnetic influence, and a second coil pair arranged adjacent to the first surface of the second rotational member and adapted to produce a rotational movement of the second rotational member about the second axis in response to interaction with a second magnetic influence.

26. A device comprising, an optical switch wherein the optical switch comprises at least one multi-axis magnetically actuated device having, a base member, a first rotational member mounted to the base member and for rotational movement about a first axis, a second rotational member having first and second opposing surfaces and being mounted to the first rotational member and for rotational movement about a second axis, a first coil pair arranged adjacent to the first surface of the second rotational member and adapted to produce a rotational movement of the first and second rotational members about the first axis in response to interaction with a first magnetic influence, and a second coil pair arranged adjacent to the first surface of the second rotational member and adapted to produce a rotational movement of the second rotational member about the second axis in response to interaction with a second magnetic influence.

27. A multi-axis magnetically actuated device comprising, a base member, a first rotational member, a first mounting means for mounting the first rotational member to the base member and for permitting rotational movement about a first axis, a second rotational member having first and second opposing surfaces, a second mounting means for mounting the second rotational member to the first rotational member and for permitting rotational movement about a second axis, a first magnetic moment means arranged adjacent to the first surface of the second rotational member for producing a rotational movement of the first and second rotational members about the first axis in response to interaction with a first magnetic influence, and a second magnetic moment means arranged adjacent to the first surface of the second rotational member for producing a rotational movement of the second rotational member about the second axis in response to interaction with a second magnetic influence.

* * * * *